(12) United States Patent
Rho et al.

(10) Patent No.: US 8,962,472 B2
(45) Date of Patent: Feb. 24, 2015

(54) SEMICONDUCTOR DEVICE WITH SELF-ALIGNED AIR GAP AND METHOD FOR FABRICATING THE SAME

(71) Applicant: SK Hynix Inc., Gyeonggi-do (KR)

(72) Inventors: Il-Cheol Rho, Gyeonggi-do (KR); Jong-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 23 days.

(21) Appl. No.: 13/844,915

(22) Filed: Mar. 16, 2013

(65) Prior Publication Data
US 2014/0187037 A1 Jul. 3, 2014

(30) Foreign Application Priority Data
Dec. 28, 2012 (KR) .................... 10-2012-0157376

(51) Int. Cl.
*H01L 21/764* (2006.01)
*H01L 29/92* (2006.01)
*H01L 27/108* (2006.01)

(52) U.S. Cl.
CPC ............. *H01L 29/92* (2013.01); *H01L 21/764* (2013.01); *H01L 27/10855* (2013.01); *H01L 27/10823* (2013.01)

USPC ............................................... 438/626; 438/421

(58) Field of Classification Search
USPC ................................................ 438/626, 421
See application file for complete search history.

(56) References Cited

U.S. PATENT DOCUMENTS

| | | | |
|---|---|---|---|
| 5,899,741 A | 5/1999 | Tseng et al. | |
| 6,136,697 A | 10/2000 | Wu | |
| 2007/0080382 A1 | 4/2007 | Kikuchi et al. | |
| 2012/0025317 A1* | 2/2012 | Zhong et al. | 257/368 |

FOREIGN PATENT DOCUMENTS

KR 1020130039525 4/2013

* cited by examiner

*Primary Examiner* — Zandra Smith
*Assistant Examiner* — Damian A Hillman
(74) *Attorney, Agent, or Firm* — IP & T Group LLP

(57) ABSTRACT

A method for fabricating a semiconductor device includes forming a plurality of semiconductor structures over a substrate, forming an interlayer dielectric layer over the semiconductor structures, etching the interlayer dielectric layer, and defining open parts between the semiconductor structures to expose a surface of the substrate, forming sacrificial spacers on sidewalls of the open parts, forming conductive layer patterns in the open parts, and causing the conductive layer patterns and the sacrificial spacers to reach each other, and defining air gaps on the sidewalls of the open parts.

9 Claims, 18 Drawing Sheets

SEMICONDUCTOR DEVICE WITH SELF-ALIGNED AIR GAP AND METHOD FOR FABRICATING THE SAME

CROSS-REFERENCE TO RELATED APPLICATIONS

The present application claims priority of Korean Patent Application No. 10-2012-0157376, filed on Dec. 28, 2012, which is incorporated herein by reference in its entirety.

BACKGROUND

1. Field

Exemplary embodiments of the present invention relate to a semiconductor device, and more particularly, to a semiconductor device with self-aligned air gaps and a method for fabricating the same.

2. Description of the Related Art

In general, a semiconductor device includes first conductive structures and second conductive structures, wherein each of the second conductive structures is formed between, for example, two first conductive structures and a dielectric layer is interposed between the first and second conductive structures. For example, the first conductive structures may include gates, bit lines, metal lines, or the likes, and the second conductive structures may include contact plugs, storage node contact plugs, bit line contact plugs, vias, or the likes.

As a semiconductor device is highly integrated, a distance between the first conductive structure and the second conductive structure gradually decreases. Due to this, the parasitic capacitance between the first conductive structure and the second conductive structure increases. As the parasitic capacitance increases, the operation speed of a semiconductor device slows down, and the refresh characteristic thereof deteriorates.

In order to reduce parasitic capacitance, a method for decreasing the dielectric constant of a dielectric layer has been suggested. A dielectric layer generally used in a semiconductor device includes silicon oxide or silicon nitride. The dielectric constant of the silicon oxide may be about 4, and the dielectric constant of the silicon nitride may be about 7.

Since the silicon oxide and the silicon nitride have stir high dielectric constants, limitations may exist in reducing parasitic capacitance. While substances with relatively low dielectric constants have been developed, the reality may be that the dielectric constants of these substances are not so low.

SUMMARY

Various embodiments are directed to a semiconductor device that may reduce parasitic capacitance between adjacent conductive structures and a method for fabricating the same.

In an exemplary embodiment of the present invention, a method for fabricating a semiconductor device may include forming a plurality of semiconductor structures over a substrate, forming an interlayer dielectric layer over the semiconductor structures, etching the interlayer dielectric layer, thereby defining open parts between the semiconductor structures; forming sacrificial spacers on sidewalls of the open parts, forming conductive layer patterns in the open parts, and causing the conductive layer patterns and the sacrificial spacers to reach each other, thereby defining air gaps on the sidewalls of the open parts. The sacrificial spacers may include a first silicidable substance, and the conductive layer patterns may include a second silicidable substance. The sacrificial spacers may include a polysilicon layer, and the conductive layer patterns may include a silicidable metal layer. The defining of the air gaps may include performing anneal and silicidating the conductive layer patterns and the sacrificial spacers.

In another exemplary embodiment of the present invention a method for fabricating a semiconductor device may include forming semiconductor structures over a substrate, defining open parts between the semiconductor structures, forming recessed sacrificial spacers on sidewalls of the open parts, wherein the recessed sacrificial spacers include a first silicidable substance, forming recessed plugs in the open parts, wherein the recessed plugs include a second silicidable substance, forming a silicidation preventing layer to cover the recessed plugs and the recessed sacrificial spacers, forming second plugs over the silicidation preventing layer, and causing the first silicidable substance and the second silicidable substance to react with each other, thereby defining air gaps on the sidewalls of the open parts. The first silicidable substance may include a polysilicon layer. The second silicidable substance may include a silicidable metal layer. The defining of the air gaps may include performing anneal and silicidating the first silicidable substance and the second silicidable substance. The silicidation preventing layer may include a metal nitride.

In still another embodiment of the present invention, a method for fabricating a semiconductor device may include forming buried gate electrodes in a substrate, forming metal pads over the substrate between the buried gate electrodes, forming an interlayer dielectric layer over an entire surface including the metal pads; forming bit line structures over the interlayer dielectric layer, forming spacers on sidewalls of the bit line structures, defining storage node contact holes between the bit line structures to expose the metal pads, forming sacrificial spacers on sidewalls of the storage node contact holes, wherein the sacrificial spacers include silicon, forming storage node contact plugs in the storage node contact holes, wherein the storage node contact plugs include a silicidable metal, and silicidating the silicon and the silicidable metal, thereby defining air gaps on the sidewalls of the storage node contact holes. The silicidating of the silicon and the silicidable metal may be performed through anneal. Each of the sacrificial spacers may comprise a polysilicon layer. The silicidable metal may comprise titanium, tungsten or platinum.

In still another embodiment of the present invention, a method for fabricating a semiconductor device may include forming buried gate electrodes in a substrate, forming metal pads over the substrate between the buried gate electrodes, forming an interlayer dielectric layer over an entire surface including the metal pads, forming bit line structures over the interlayer dielectric layer, forming spacers on side ails of the bit line structures, defining storage node contact holes between the bit line structures in such a way as to expose the metal pads, forming sacrificial spacers on sidewalls of the storage node contact holes, wherein the sacrificial spacers include silicon, forming recessed storage node contact plugs in the storage node contact holes, wherein the recessed storage node contact plugs include a silicidable metal, forming a silicidation preventing layer over the recessed storage node contact plugs, forming second storage node contact plugs over the silicidation preventing layer, and silicidating the silicon and the silicidable metal, thereby defining air gaps on the sidewalls of the storage node contact holes.

In still another embodiment of the present invention, a semiconductor device may include a plurality of conductive structures, metal plugs formed between the conductive structures, metal silicide layers formed on sidewalls of the metal plugs, and air gaps defined between sidewalls of the conductive structures and the metal silicide layers. The metal silicides may contain a metal of the metal plugs. The metal plugs may include tungsten, and the metal silicides may include a tungsten silicide. The metal plugs may include storage node contact plugs, and the conductive structures may include bit line structures. The metal silicide layers may contain a metal of the metal plugs. The metal plugs comprise tungsten, and the metal silicide layers may comprise tungsten silicide. The metal plugs comprise storage node contact plugs, and the conductive structures may comprise bit line structures.

In still another embodiment of the present invention, a semiconductor device may include a plurality of conductive structures, recessed metal plugs formed between the conductive structures, metal silicide layers formed on sidewalls of the recessed metal plugs, air gaps defined between sidewalls of the conductive structures and the metal silicide layers, capping layers capping the air gaps, and second metal plugs formed over the capping layers. The metal silicide layers may contain a metal of the first metal plugs. The capping layers may have shapes that cover the recessed metal plugs and the metal silicide layers. The capping layers may comprise titanium nitride. The capping layers may have spacer structures that are formed on sidewalls of the second metal plugs while capping the air gaps. Each of the capping layers may comprise a dielectric substance. The recessed metal plugs and the second metal plugs comprise tungsten, and the metal silicide layers comprise tungsten silicide. The recessed metal plugs and the second metal plugs comprise storage node contact plugs, and the conductive structures comprise bit line structures.

DETAILED DESCRIPTION

Figure 1:
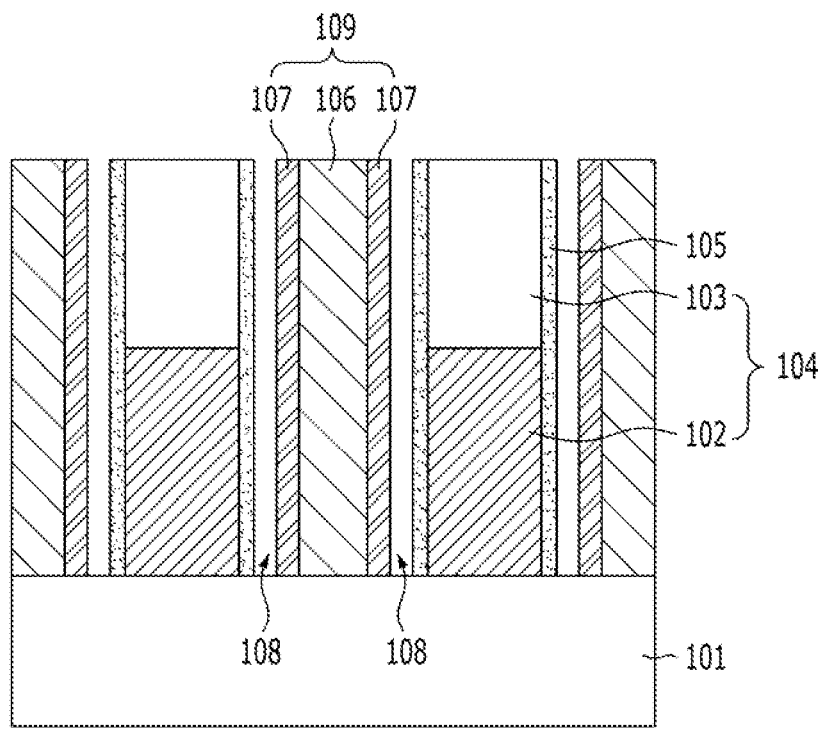
FIG. 1 is a cross-sectional view illustrating a semiconductor device in accordance with a first embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate it not only refers to a case where the first layer is formed directly on the second layer or the substrate but also a case where a third layer exists between the first layer and the second layer or the substrate.

FIG. 1 is a cross-sectional view illustrating a semiconductor device in accordance with a first embodiment of the present invention.

Referring to FIG. 1, a plurality of conductive structures are formed on a substrate 101. The conductive structures may include, first conductive structures 104 and second conductive structures 109. Air gaps 108 may be defined between the respective first conductive structures 104 and the respective second conductive structures 109.

Each of the first conductive structures 104 may include a first conductive layer 102. Each of the first conductive structures 104 may be a stack structure that includes the first conductive layer 102 and a hard mask layer 103. The first conductive layer 102 may include a silicon-containing layer or a metal-containing layer. The first conductive layer 102 may include a silicon-containing layer and a metal-containing layer, which are stacked. The first conductive layer 102 may include polysilicon, a metal, a metal nitride, a metal silicide, or the like. The first conductive layer 102 may include a polysilicon layer and a metal layer, which are stacked. The metal layer may include tungsten. The hard mask layer 103 may include a dielectric substance. The hard mask layer 103 may include an oxide or a nitride. Any one conductive structure of the first conductive structure 104 and the second conductive structure 109 may be a line type that extends in any one direction. The other conductive structures of the first conductive structures 104 and the second conductive structures 109 may have a plug shape. For example, the first conductive structures 104 may be line type structures, and the second conductive structures 109 may be plug-shaped structures. The first conductive structures 104 may be disposed at regular intervals on the substrate 101.

Each of the second conductive structures 109 may include a second conductive layer 106 and third conductive layers 107. The second conductive layer 106 and the third conductive layers 107 may include metal-containing layers. The third conductive layers 107 may be formed on the sidewalls of the second conductive layer 106. The second conductive layer 106 may include titanium, tungsten or platinum. The third conductive layers 107 include a silicide of the metal contained in the second conductive layer 106. The third conductive layers 107 may include a metal silicide. The third conductive layers 107 may include a silicide of the second conductive layer 106. The metal silicide may include titanium silicide, tungsten silicide or platinum silicide. In this way, as a metal silicide of the third conductive layers 107 is formed as a silicide of the second conductive layer 106, the air gaps 108 may be defined in a self-aligned manner.

Spacers 105 may be additionally formed on both sidewalls of each of the first conductive structures 104. The spacers 105 may include a dielectric substance. The spacers 105 may include silicon oxide or silicon nitride. The spacers 105 may perform a dielectric function between the first conductive structures 104 and the second conductive structures 109 in cooperation with the air gaps 108.

Any ones of the first conductive structures 104 and the second conductive structures 109 may include gates or bit lines. The others of the first conductive structures 104 and the second conductive structures 109 may include contact plugs. The contact plugs may include storage node contact plugs, landing plugs, or the likes. In FIG. 1, the first conductive layers 102 of the first conductive structures 104 may include bit lines, and the second conductive structures 109 may include storage node contact plugs. Accordingly, the air gaps 108 may be defined between the bit lines and the storage node contact plugs. In another embodiment, the first conductive layers 102 of the first conductive structures 104 may include gate electrodes, and the second conductive structures 109 may include contact plugs that are connected to source/drain regions. Since the second conductive layers 106 include metal-containing layers, the storage node contact plugs or the contact plugs may be metal plugs.

As shown in FIG. 1, the air gaps 108 are defined between the first conductive structures 104 and the second conductive structures 109. The air gaps 108 with the dielectric constant of 1 reduce the parasitic capacitances between the first conductive structures 104 and the second conductive structures 109.

FIGS. 2A to 2G are cross-sectional views showing an exemplary method for forming the semiconductor device in accordance with the first embodiment of the present invention.

Figure 2A:
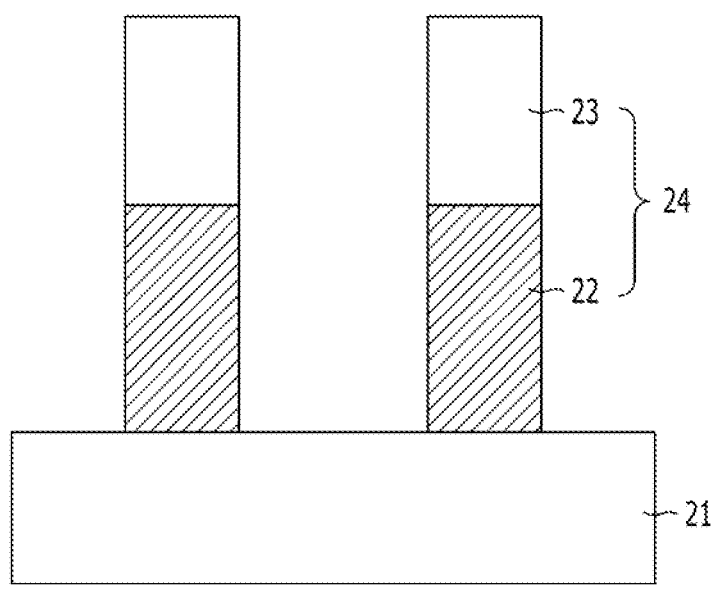
FIGS. 2A to 2G are cross-sectional views showing an exemplary method for forming the semiconductor device in accordance with the first embodiment of the present invention.

Referring to FIG. 2A, a plurality of semiconductor structures, for example, first conductive structures 24 are formed on a substrate 21. The substrate 21 may include a semiconductor substrate. The substrate 21 may include a silicon substrate or a silicon germanium substrate. Also, the substrate 21 may include an SOI substrate.

The first conductive structures 24 formed on the substrate 21 may be line types that are disposed at regular intervals, for example, a given intervals. In order to form the first conductive structures 24, hard mask patterns 23 are formed on a first conductive layer. By etching the first conductive layer using the hard mask patterns 23 as an etch mask, first conductive layer patterns 22 are formed. The first conductive structures 24 in which the first conductive layer patterns 22 and the hard mask patterns 23 are stacked are formed. The first conductive layer patterns 22 may include a silicon-containing layer or a metal-containing layer. For example, the first conductive layer patterns 22 may include a polysilicon layer or a metal layer. Further, the first conductive layer patterns 22 may be formed by, for example, stacking a polysilicon layer and a metal layer, and a barrier layer may be additionally formed between the polysilicon layer and the metal layer. The first conductive layer patterns 22 may include a stack structure of a polysilicon layer, a titanium-containing layer and a tungsten layer. The titanium-containing layer as the barrier layer may include a titanium layer and a titanium nitride layer, which are stacked.

Figure 2B:
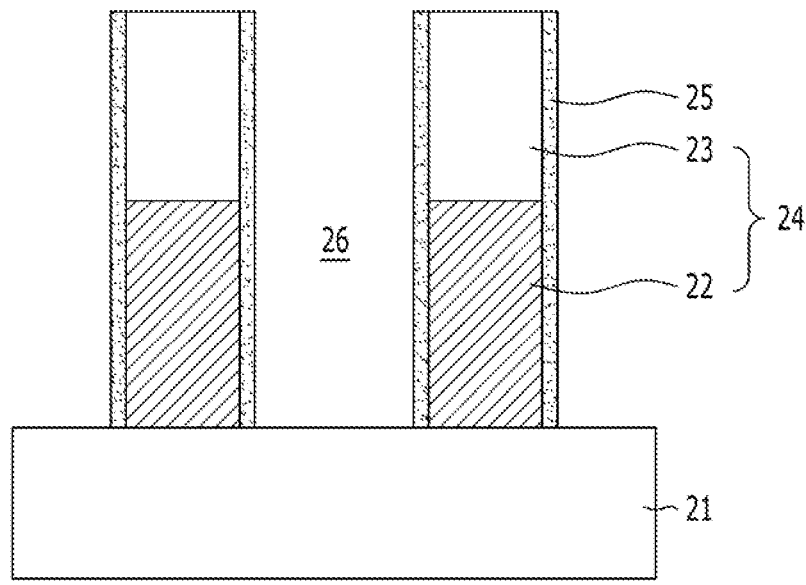

Referring to FIG. 2B, spacers 25 are formed on both sidewalls of each of the first conductive structures 24. In order to form the spacers 25, after forming a dielectric layer (not shown) on the entire surface including the first conductive structures 24, the dielectric layer may be etched back. The spacers 25 may include a nitride or an oxide. The spacers 25 may include silicon nitride or silicon oxide.

By forming the spacers 25 in this way, open parts 26 may be defined between the first conductive structures 24 in such a way as to expose the substrate 21. In another embodiment, after forming the spacers 25, an interlayer dielectric layer (not shown) may be formed. By etching the interlayer dielectric layer, the open parts 26 may be defined between the first conductive structures 24. The spacers 25 may be formed after defining the open parts 26. The open parts 26 may be defined to expose the sidewalls of the spacers 25. The open parts 26 may be line types or may have contact hole shapes. For example, in the case where the first conductive structures 24 include bit line structures, the open parts 26 may include storage node contact holes. The spacers 25 may prevent the first conductive layer patterns 22 of the first conductive structures 24 from reacting with sacrificial spacers (see the reference numeral 27 of FIG. 2D) during subsequent silicidation.

Figure 2C:
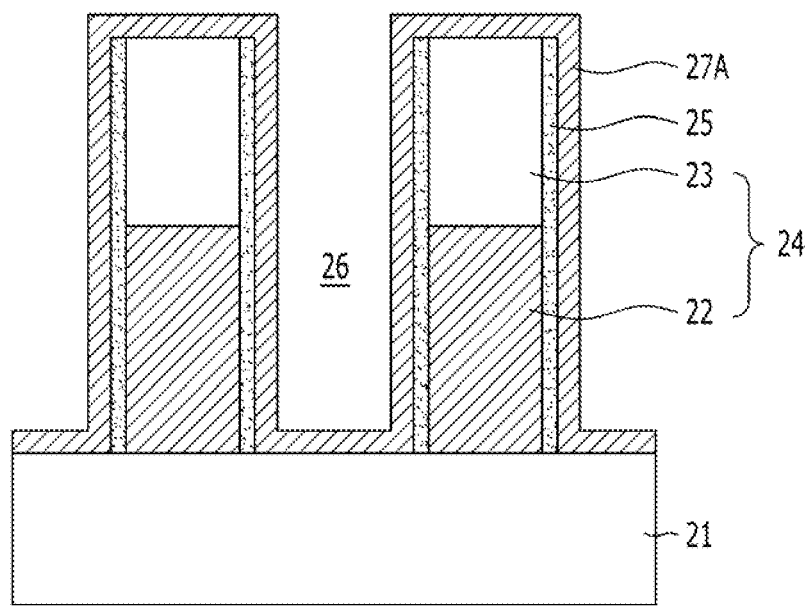

Referring to FIG. 2C, a sacrificial spacer substance layer 27A is formed on the entire surfaces of the first conductive structures 24 including the open parts 26 and the spacers 25. The sacrificial spacer substance layer 27A may include a silicidable substance. That is to say, the sacrificial spacer substance layer 27A may include a first silicidable substance. The sacrificial spacer substance layer 27A may include a silicon-containing layer. The sacrificial spacer substance layer 27A may include a polysilicon layer. The thickness of the sacrificial spacer substance layer 27A may be set to be a thickness for a volume shrinkage in consideration of the widths of air gaps that will be subsequently defined.

Figure 2D:
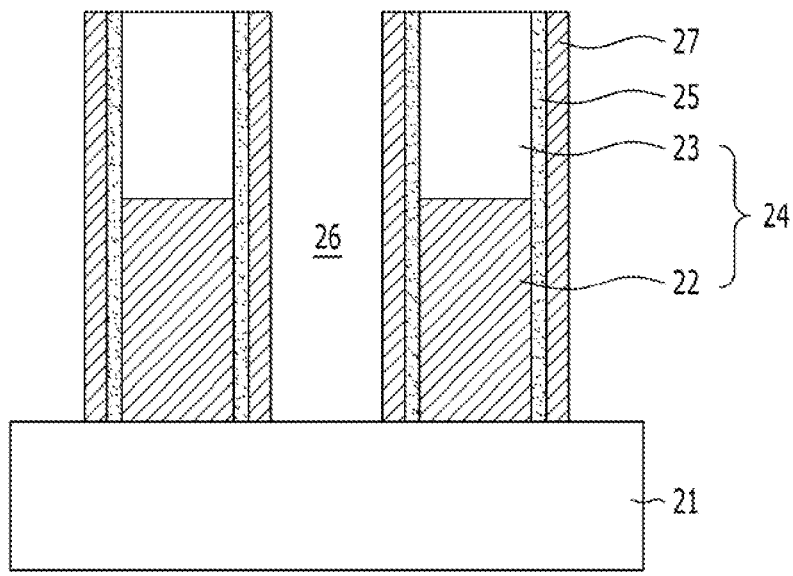

Referring to FIG. 2D, sacrificial spacers 27 are formed. In order to form the sacrificial spacers 27, the sacrificial spacer substance layer 27A may be etched through an etch-back process.

The sacrificial spacers 27 cover the sidewalls of the spacers 25. Accordingly, double spacer structures of the spacers 25 and the sacrificial spacers 27 may be formed on both sidewalls of the first conductive structures 24. The spacers 25 include a dielectric substance, and the sacrificial spacers 27 include a silicidable substance.

Figure 2E:
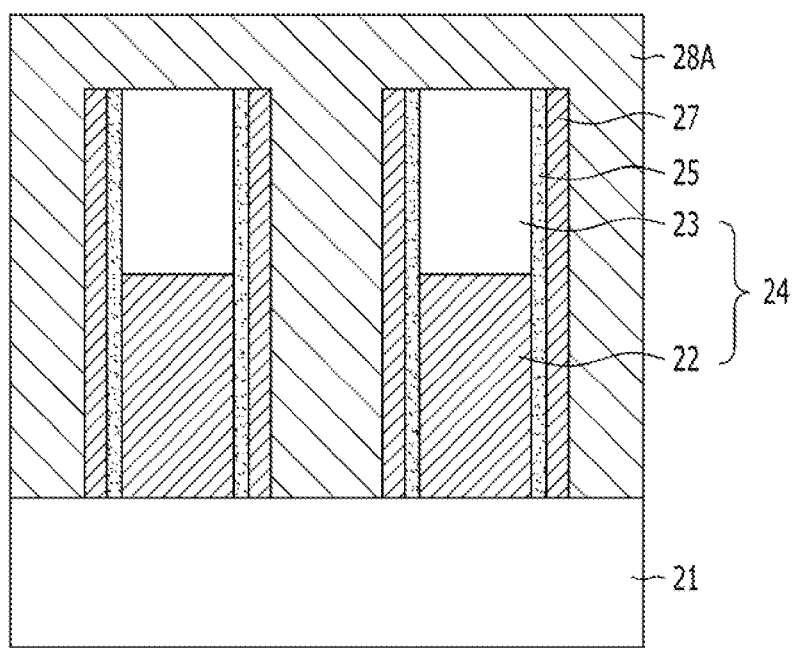

Referring to FIG. 2E, a second conductive layer 28A is formed to fill the open parts 26 in which the sacrificial spacers 27 are formed. The second conductive layer 28A is a substance to be metal plugs and may include a silicidable substance. The second conductive layer 28A may include a second silicidable substance. The second conductive layer 28A may include a substance that forms a metal silicide through silicidation with each of the sacrificial spacers 27. The second conductive layer 28A may include a silicidable metal. The second conductive layer 28A may include a tungsten layer. Also, the second conductive layer 28A may include titanium (Ti) or platinum (Pt).

Figure 2F:
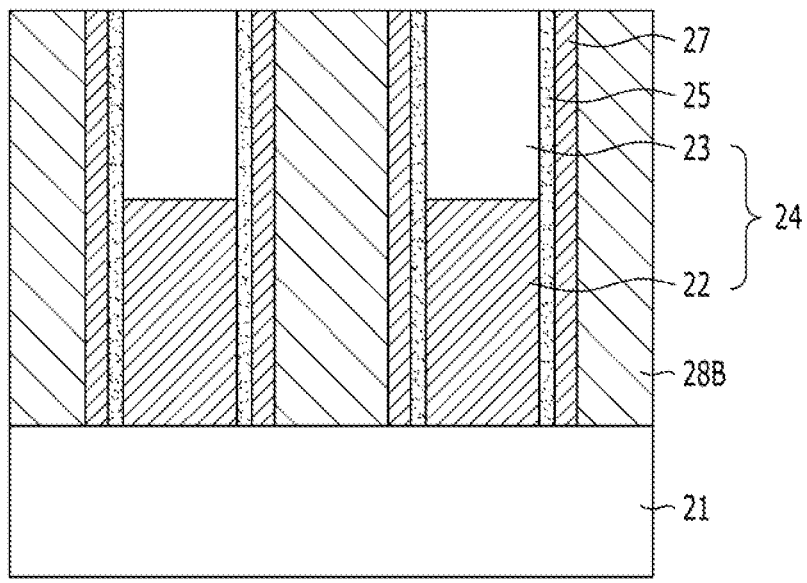

Referring to FIG. 2F, the second conductive layer 28A is planarized until the surfaces of the first conductive structures 24 are exposed. Accordingly, second conductive layer patterns 28B are formed between the first conductive structures 24. In order to planarize the second conductive layer 28A, an etch-back process or a CMP (chemical mechanical polishing) process may be adopted. The second conductive layer patterns 28B may be contact plugs. The second conductive layer patterns 28B may be metal plugs. In the case where the first conductive structures 24 include bit line structures, the second conductive layer patterns 28B may be storage node contact plugs. The second conductive layer patterns 28B may have shapes that are surrounded by the sacrificial spacers 27. Dielectric structures of the spacers 25 are formed between the first conductive structures 24 and the second conductive layer patterns 28B.

Figure 2G:
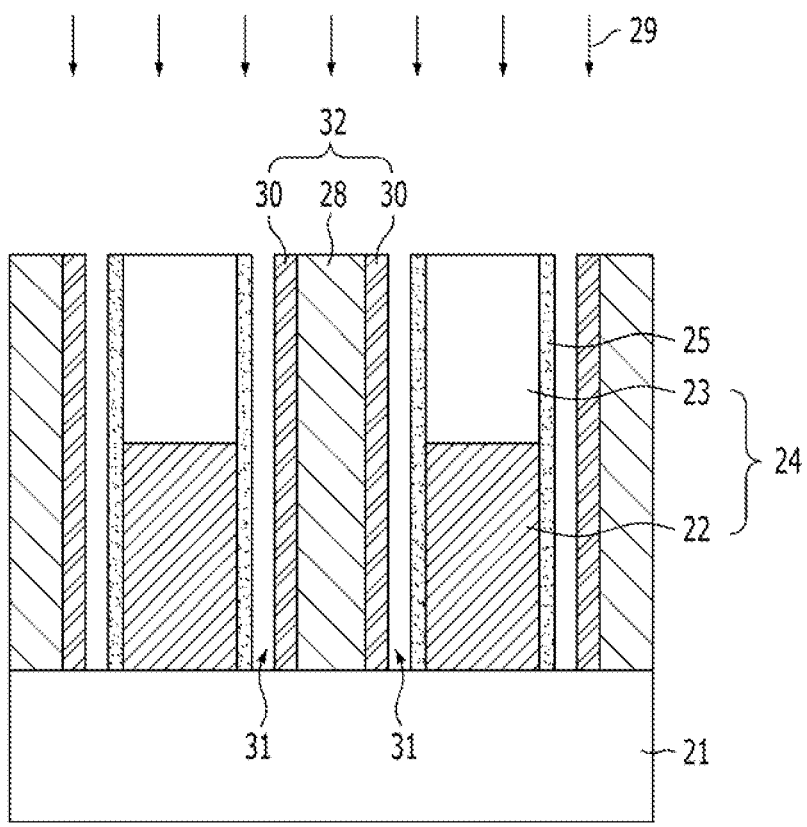

Referring to FIG. 2G, the second conductive layer patterns 28B and the sacrificial spacers 27 are caused to reach each other. For example anneal 29 is performed. Accordingly, silicidation occurs. In detail, as silicidation occurs on the sidewalls of the sacrificial spacers 27 and the second conductive layer patterns 28B, metal silicide layer 30 are formed. The metal silicide layers 30 are formed on the sidewalls of the second conductive layer patterns 28B. Thus, the line widths of the second conductive layer patterns 28B may be decreased as indicated by the reference numeral 28. As the metal silicide layers 30 are formed, second conductive structures 32 are formed. The second conductive structures 32 include the second conductive layer patterns 28 and the metal silicide layers 30. The metal silicide layers 30 are formed on the sidewalls of the second conductive layer patterns 28.

As the metal silicide layers 30 are formed, air gaps 31 are defined between the second conductive layer patterns 28 and the sidewalls of the open parts 26. In other words, when the sacrificial spacers 27 and the second conductive layer patterns 28B reach each other and phase transition occurs to the metal silicide layers 30, since volumes shrink, the air gaps 31 are defined in a self-aligned manner. The anneal 29 may be performed at a temperature of at least 200° C. such that the sacrificial spacers 27 and the second conductive layer patterns 28B induce silicidation. When the metal silicide layers 30 are formed, silicidation of the first conductive layer patterns 22 is suppressed. This is because the first conductive layer patterns 22 are protected by the spacers 25.

As the metal silicide layers 30 are formed on the sidewalls of the second conductive layer patterns 28 by the anneal 29 performed as described above, the air gaps 31 are defined in the self-aligned manner. By defining the air gaps 31 in the self-aligned manner, the parasitic capacitances between the first conductive layer patterns 22 and the second conductive layer patterns 28 are reduced.

Subsequently, while not shown, a capping layer (not shown) may be formed to cap the air gaps 31. The capping layer may include a dielectric substance or a conductive substance. The capping layer may include silicon oxide, silicon nitride or a metal layer. By forming the capping layer, it may be possible to prevent the air gaps 31 from being open during a subsequent process. The capping layer may be omitted.

Figure 3A:
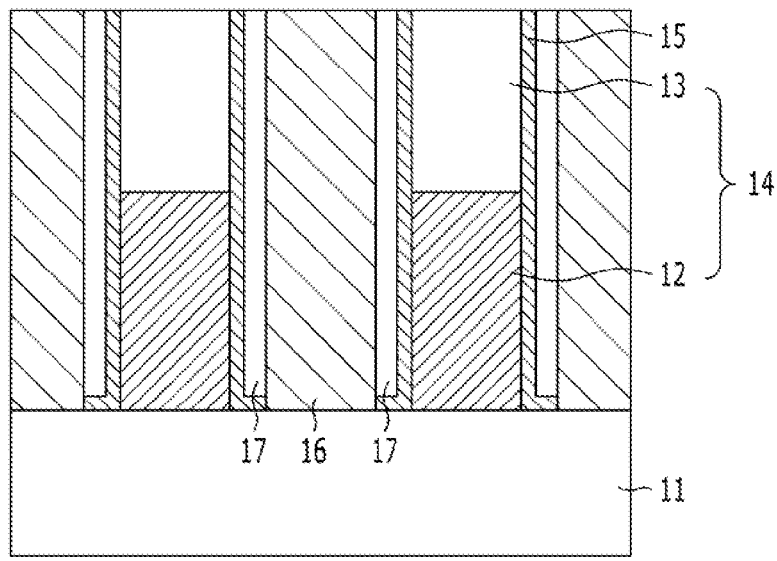
FIGS. 3A and 3B are cross-sectional views explaining a comparative example of the first embodiment of the present invention.
Figure 3B:
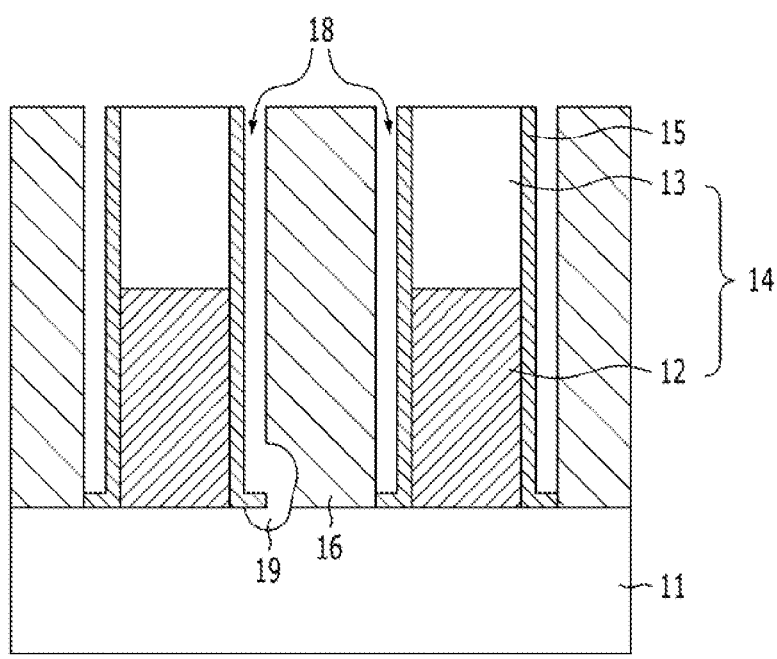

FIGS. 3A and 3B are cross-sectional views explaining a comparative example of the first embodiment of the present invention.

Referring to FIGS. 3A and 3B, a plurality of first conductive structures 14 having a first conductive layer 12 and a hard mask layer 13 stacked therein are formed on a substrate 11. Second conductive layers 16 of second conductive structures are formed between the first conductive structures 14. Air gaps 18 are defined between the first conductive structures 14 and the second conductive layer 16. Spacers 15 are formed on the sidewalls of each of the first conductive structures 14.

In this comparative example, in order to define the air gaps 18 sacrificial spacers 17 are formed of silicon oxide, silicon nitride or titanium nitride (TiN).

By dipping out the sacrificial spacers 17 after forming the second conductive layer 16, the air gaps 18 are defined.

However, in the process for dipping out the sacrificial spacers 17, the second conductive layers 16 and structures formed under the second conductive layers 16 may be attacked. For example, in the case where the second conductive layers 16 and the underlying structures include metal layers, metal layers with no etching selectivity or inferior immunity with respect to a chemical that is used in the dip-out process may be lost (see the reference numeral 19).

Therefore, as in the aforementioned embodiment, by defining air gaps in a self-aligned manner by using silicidation, a dip-out process is not needed, and accordingly, loss of conductive layer patterns and underlying structures may be prevented.

Figure 4:
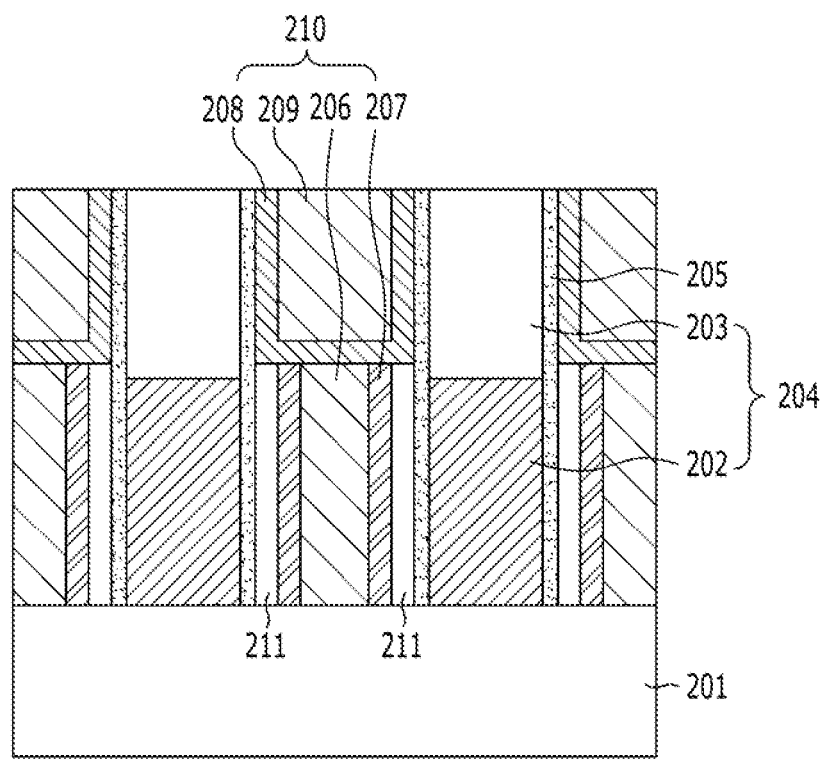
FIG. 4 is a cross-sectional view illustrating a semiconductor device in accordance with a second embodiment of the present invention.

FIG. 4 is a cross-sectional view illustrating a semiconductor device in accordance with a second embodiment of the present invention.

Referring to FIG. 4, a plurality of conductive structures are formed on a substrate 201. The conductive structures may include first conductive structures 204 and second conductive structures 210. Air gaps 211 may be defined between the first conductive structures 204 and the second conductive structures 210.

Each of the first conductive structures 204 may include a first conductive layer 202. The first conductive structure 204 may be a stack structure that includes the first conductive layer 202 and a hard mask layer 203. The first conductive layer 202 may include a silicon-containing layer or a metal-containing layer. The first conductive layer 202 may include a silicon-containing layer and a metal-containing layer, which are stacked. The first conductive layer 202 may include polysilicon, a metal, a metal nitride, a metal silicide, or the like. The first conductive layer 202 may include a polysilicon layer and a metal layer, which are stacked. The metal layer may include tungsten. The hard mask layer 203 may include a dielectric substance. The hard mask layer 203 may include an oxide or a nitride. Any one conductive structure of the first conductive structure 204 and the second conductive structure 210 may be a line type that extends in any one direction. The other conductive structure of the first conductive structure 204 and the second conductive structure 210 may have a plug shape. For example, the first conductive structures 204 may be line type structures, and the second conductive structures 210 may be plug-shaped structures. The first conductive structures 204 may be disposed at regular intervals on the substrate 201.

Each of the second conductive structures 210 may include a second conductive layer 206 that is recessed between the first conductive structures 204, third conductive layers 207 that are formed on the sidewalls of the second conductive layer 206, a fourth conductive layer 208 that is formed on the second conductive layer 206 and the third conductive layers 207, and a fifth conductive layer 209 that is formed on the fourth conductive layer 208. The fourth conductive layer 208 may have patterns that cap the upper ends of the air gaps 211. The second conductive layer 206, the fourth conductive layer 208 and the fifth conductive layer 209 may include metal-containing layers. The second conductive layer 206 may include titanium, tungsten or platinum. The third conductive layer 207 may include a silicide of the second conductive layer 206. The third conductive layer 207 includes a silicide of the metal that is contained in the second conductive layer 206. The third conductive layer 207 may include a metal silicide. The metal silicide may include titanium silicide, tungsten silicide or platinum silicide. Due to these facts as the third conductive layer 207 is formed as the silicide of the second conductive layer 206, the air gaps 211 may be defined in a self-aligned manner. The fourth conductive layer 208 is a silicidation preventing layer. In other words, while a metal silicide is formed as the third conductive layer 207, the fourth conductive layer 208 prevents the fifth conductive layer 209 from being silicidated. The fourth conductive layer 208 may include a metal nitride. The fourth conductive layer 208 may include titanium nitride. The fifth conductive layer 209 as a metal-containing layer may include a tungsten layer.

Spacers 205 may be additionally formed on both sidewalls of the first conductive structures 204. The spacers 205 may include a dielectric substance. The spacers 205 may include silicon oxide or silicon nitride. The spacers 205 may perform a dielectric function between the first conductive structures 204 and the second conductive structures 210 in cooperation with the air gaps 211.

Any ones of the first conductive structures 204 and the second conductive structures 210 may include gates or bit lines. The others of the first conductive structures 204 and the second conductive structures 210 may include contact plugs. The contact plugs may include storage node contact plugs, landing plugs, or the likes. The first conductive layer 202 of the first conductive structures 204 may include bit lines, and the second conductive structures 210 may include storage node contact plugs. Accordingly, the air gaps 211 may be defined between the bit lines and the storage node contact plugs.

As shown in FIG. 4, the air gaps 211 are defined between the first conductive structures 204 and the second conductive structures 210. The air gaps 211 with the dielectric constant of 1 reduce the parasitic capacitances between the first conductive structures 204 and the second conductive structures 210.

FIGS. 5A to 5D are cross-sectional views showing an exemplary method for forming the semiconductor device in accordance with the second embodiment of the present invention. Second conductive layer patterns 28B are formed between first conductive structures 24 according to the method shown in FIGS. 2A to 2F. Sacrificial spacers 27 are formed on the sidewalls of the second conductive layer patterns 28B. The sacrificial spacers 27 cover the sidewalls of the spacers 25.

Figure 5A:
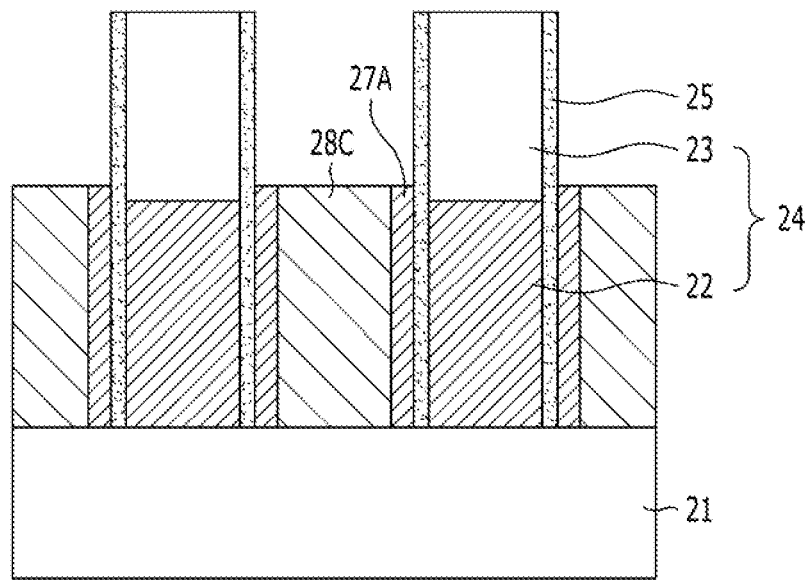
FIGS. 5A to 5D are cross-sectional views showing an exemplary method for forming the semiconductor device in accordance with the second embodiment of the present invention.

Next, referring to FIG. 5A, the second conductive layer patterns 28B and the sacrificial spacers 27 are recessed. According to this, second conductive layer patterns 28C and sacrificial spacers 27B are formed between the first conductive structures 24. In order to recess the second conductive layer patterns 28B, an etch-back process may be adopted. The second conductive layer patterns 28C may become contact plugs. In the case where the first conductive structures 24 include bit line structures, the second conductive layer patterns 28C may become storage node contact plugs. The second conductive layer patterns 28C may have shapes that are surrounded by the sacrificial spacers 27B.

Figure 5B:
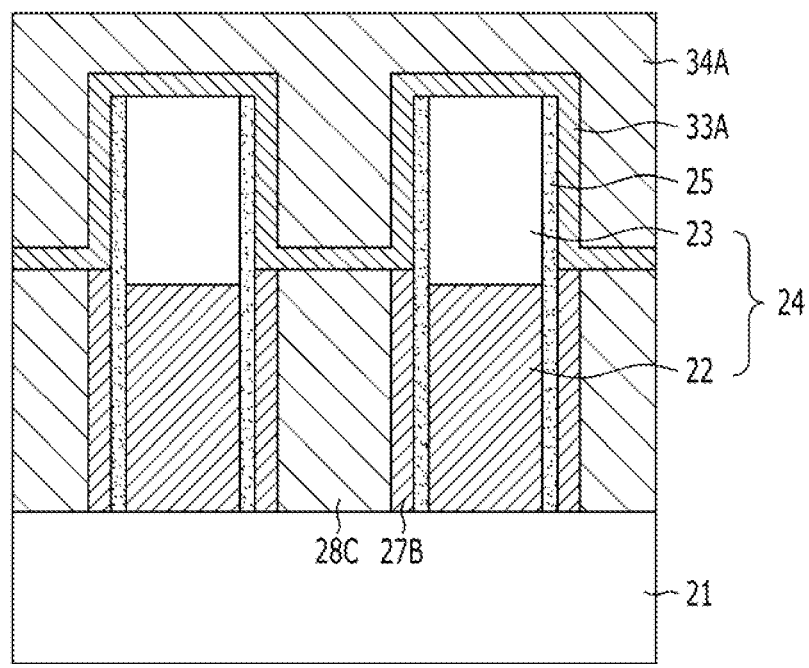

Referring to FIG. 5B a silicidation preventing layer 33A is formed. The silicidation preventing layer 33A may be conformally formed on the second conductive layer patterns 28C. The silicidation preventing layer 33A includes a substance that prevents occurrence of silicidation during a subsequent anneal process. Namely, the silicidation preventing layer 33A may be formed using a substance that does not react with the sacrificial spacers 27B. The silicidation preventing layer 33A may include a nitride. Since the silicidation preventing layer 33A may have conductivity, it may include a nitride with conductivity. The silicidation preventing layer 33A may include a metal nitride. The silicidation preventing layer 33A may include titanium nitride. The silicidation preventing layer 33A may also perform the function of a barrier layer. That is to say, the silicidation preventing layer 33A may perform the function of preventing reaction between the second conductive layer patterns 28C and third conductive layer patterns that will be subsequently formed.

A third conductive layer 34A is gapfilled on the silicidation preventing layer 33A. The third conductive layer 34A may include a metal-containing layer. The third conductive layer 34A may include a tungsten layer. The thicknesses of the silicidation preventing layer 33A and the third conductive layer 34A may be controlled in consideration of depths by which the silicidation preventing layer 33A and the third conductive layer 34A are lost during a subsequent process.

Figure 5C:
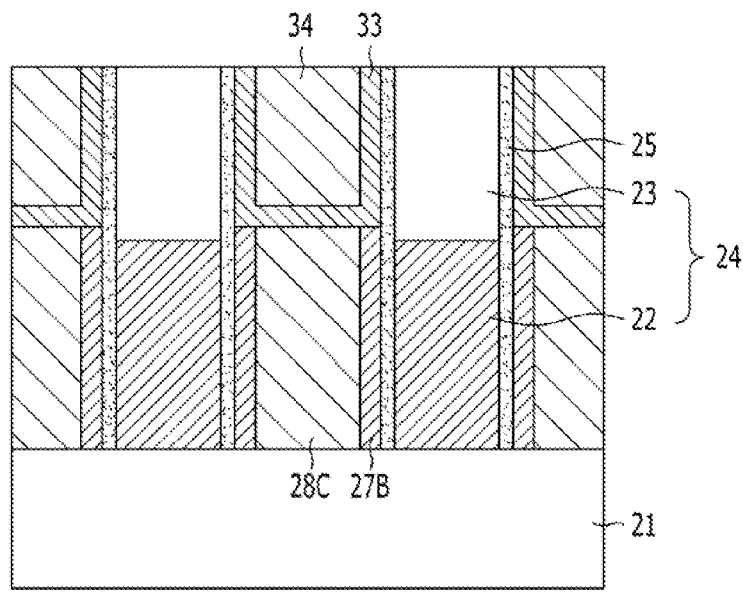

Referring to FIG. 5C, the third conductive layer 34A and the silicidation preventing layer 33A are planarized. Accordingly, third conductive layer patterns 34 are formed. The silicidation preventing layer 33A remains as indicated by the reference numeral 33 while contacting the sidewalls and the lower surfaces of the third conductive layer patterns 34. Furthermore, the silicidation preventing layer 33 covers the sacrificial spacers 27B and the second conductive layer patterns 28C.

Figure 5D:
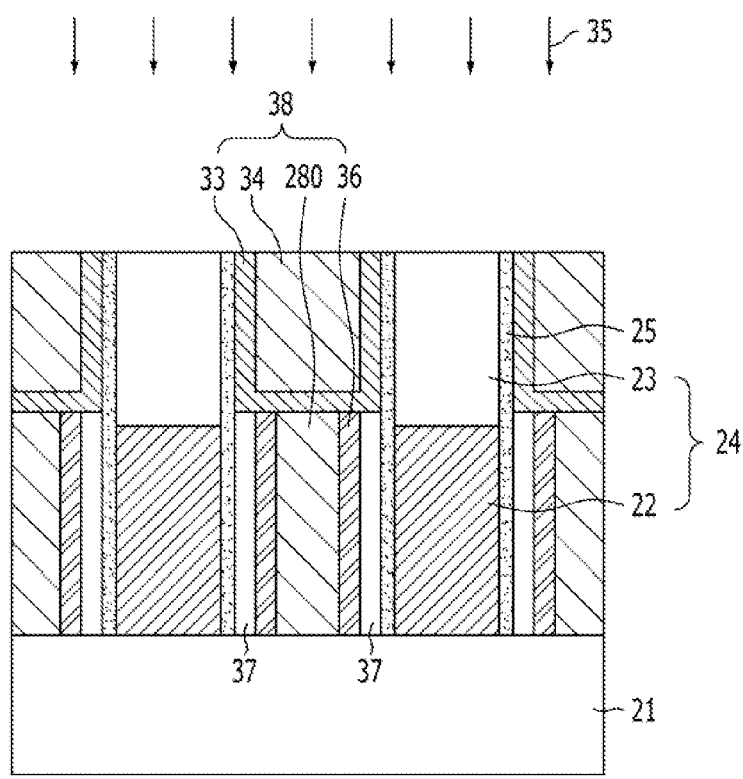

Referring to FIG. 5D, anneal 35 is performed. Accordingly, metal silicidation occurs. In detail, as silicidation occurs on the sidewalls of the sacrificial spacers 27B and the second conductive layer patterns 28C, metal silicide layers 36 are formed. As the metal silicide layers 36 are formed, second conductive layer patterns 280 with a decreased line width are formed, and air gaps 37 are defined between the second conductive layer patterns 280 and the sidewalls of the first conductive structures 24. In other words, as the metal silicide layers 36 are formed, when the sacrificial spacers 27B and the second conductive layer patterns 28C reach each other and phase transition occurs to the metal silicide layers 36, since volumes shrink, the air gaps 37 are defined in a self-aligned manner. The anneal 35 may be performed at a temperature of at least 200° C. such that the sacrificial spacers 27B and the second conductive layer patterns 28C induce silicidation. When the metal silicide layers 36 are formed, silicidation of first conductive layer patterns 22 is suppressed. This is because the first conductive layer patterns 22 are protected by the spacers 25. Also, when the metal silicide layers 36 are formed, silicidation of the third conductive layer patterns 34 is suppressed by the silicidation preventing layers 33. By forming the metal silicide layers 36 as described above, second conductive structures 38 including the second conductive layer patterns 280, the silicidation preventing layers 33 and the third conductive layer patterns 34 are formed. The second conductive layer patterns 280 may become the bottom plugs of storage node contact plugs, and the third conductive layer patterns 34 may become the top plugs of the storage node contact plugs. Since each of the second conductive layer patterns 280 includes a metal-containing layer and each of the third conductive layer patterns 34 includes a metal-containing layer, the second conductive structures 38 may be formed as metal plug structures.

As the metal silicide layers 36 are formed on the sidewalls of the second conductive layer patterns 280 by the anneal 35 performed as described above, the air gaps 37 are defined in the self-aligned manner. By defining the air gaps 37 in this way, the parasitic capacitances between the first conductive layer patterns 22 and the second conductive layer patterns 280 may be reduced.

According to the second embodiment of the present invention, a capping layer for capping the air gaps 37 may be omitted. This is because the silicidation preventing layer 33 performs the function of capping the air gaps 37. Thus, due to the presence of the silicidation preventing layer 33, it may be possible to prevent the air gaps 37 from being open during a subsequent process.

Figure 6:
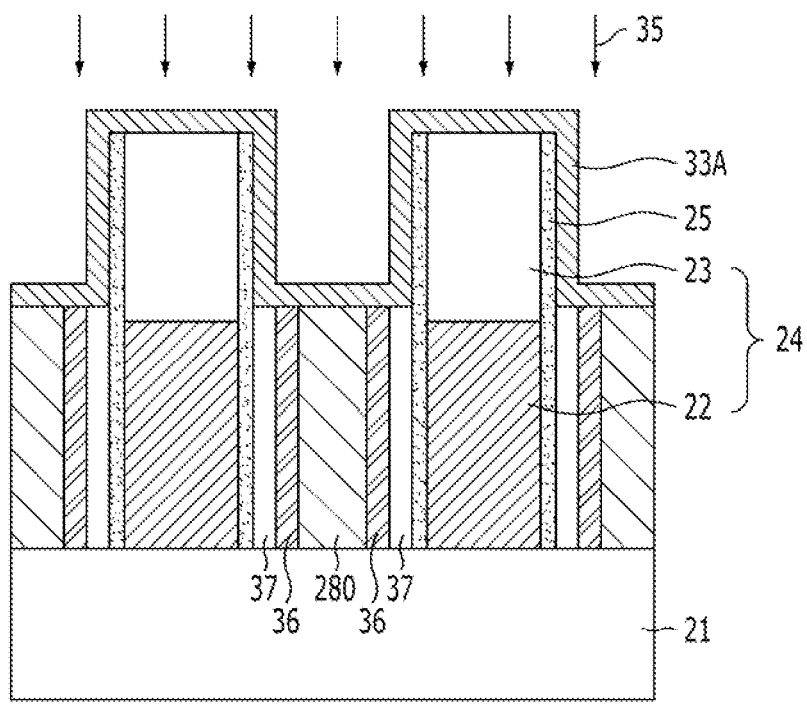
FIG. 6 is a cross-sectional view showing an exemplary method for forming a semiconductor device in accordance with a variation of the second embodiment.

FIG. 6 is a cross-sectional view showing an exemplary method for forming a semiconductor device in accordance with a variation of the second embodiment of the present invention. In FIG. 6, metal silicide layers 36 are formed by performing anneal 35 after forming a silicidation preventing layer 33A.

First, second conductive layer patterns 28B are formed between first conductive structures 24 according to the method shown in FIGS. 2A to 2F. As shown in FIGS. 2A to 2F, sacrificial spacers 27 are formed on the sidewalls of the second conductive layer patterns 28B. The sacrificial spacers 27 cover the sidewalls of the spacers 25. Thereafter, by the method shown in FIG. 5A, the second conductive layer patterns 28B and the sacrificial spacers 27 are recessed. As shown in FIG. 5A, second conductive layer patterns 28C and sacrificial spacers 27B are formed between the first conductive structures 24. In order to recess the second conductive layer patterns 28B, an etch-back process may be adopted. The second conductive layer patterns 28C may become contact plugs. In the case where the first conductive structures 24 include bit line structures, the second conductive layer patterns 28C may become storage node contact plugs. The second conductive layer patterns 28C may have shapes that are surrounded by the sacrificial spacers 27B.

Next, referring to FIG. 6, a silicidation preventing layer 33A is formed. The silicidation preventing layer 33A may be conformally formed on the second conductive layer patterns 28C as shown in FIG. 5A. The silicidation preventing layer 33A includes a substance that prevents occurrence of silicidation during a subsequent anneal process. Namely, the silicidation preventing layer 33A may be formed using a substance that does not react with the sacrificial spacers 27B shown in FIG. 5B. The silicidation preventing layer 33A may include a nitride. Since the silicidation preventing layer 33A may have conductivity, it may include a nitride with conductivity. The silicidation preventing layer 33A may include a metal nitride. The silicidation preventing layer 33A may include a titanium nitride. The silicidation preventing layer 33A may also perform the function of a barrier layer. That is to say, the silicidation preventing layer 33A may perform the function of preventing reaction between the second conductive layer patterns 28C shown in FIG. 5A and third conductive layer patterns that will be subsequently formed.

Anneal 35 is performed. Accordingly, metal silicidation occurs. In detail, as silicidation occurs on the sidewalls of the sacrificial spacers 27B and the second conductive layer patterns 28C shown in FIG. 5B, metal silicide layers 36 are formed. As the metal silicide layers 36 are formed, second conductive layer patterns 280 with a decreased line width are formed, and air gaps 37 are defined between the second conductive layer patterns 280 and the sidewalls of the first conductive structures 24. In other words, as the metal silicide layers 36 are formed—when the sacrificial spacers 27B and the second conductive layer patterns 28C shown in FIG. 5A reach each other and phase transition occurs to the metal silicide layers 36—since volumes shrink, the air gaps 37 are defined in a self-aligned manner. The anneal 35 may be performed at a temperature of at least 200° C. such that the sacrificial spacers 27B and the second conductive layer patterns 28C shown in FIG. 5A induce silicidation. When the metal silicide layers 36 are formed, silicidation of first conductive layer patterns 22 is suppressed. This is because the first conductive layer patterns 22 are protected by the spacers 25.

As the metal silicide layers 36 are formed on the sidewalls of the second conductive layer patterns 280 by the anneal 35 performed as described above, the air gaps 37 are defined in the self-aligned manner. By defining the air gaps 37 in this way, the parasitic capacitances between the first conductive layer patterns 22 and the second conductive layer patterns 280 may be reduced.

FIGS. 7A to 7D are cross-sectional views showing an exemplary method for forming a semiconductor device in accordance with a third embodiment of the present invention. Second conductive layer patterns 28B are formed between first conductive structures 24 according to the method shown in FIGS. 2A to 2F. As shown in FIGS. 2A to 2F, sacrificial spacers 27 are formed on the sidewalls of the second conductive layer patterns 28B. The sacrificial spacers 27 cover the sidewalls of the spacers 25.

Next, referring to FIG. 5A, the second conductive layer patterns 28B and the sacrificial spacers 27 are recessed. As shown in FIG. 5A, second conductive layer patterns 28C and sacrificial spacers 27B are formed between the first conductive structures 24. In order to recess the second conductive layer patterns 28B, an etch-back process may be adopted. The second conductive layer patterns 28C may become contact plugs. In the case where the first conductive structures 24 include bit line structures, the second conductive layer patterns 28C may become storage node contact plugs. The second conductive layer patterns 28C may have shapes that are surrounded by the sacrificial spacers 27B.

Figure 7A:
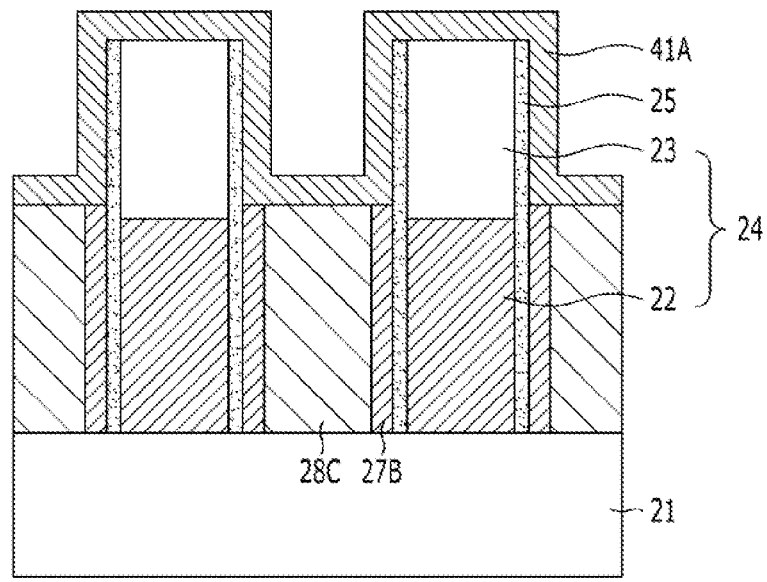
FIGS. 7A to 7D are cross-sectional views showing an exemplary method for forming a semiconductor device in accordance with a third embodiment of the present invention.
Figure 7B:
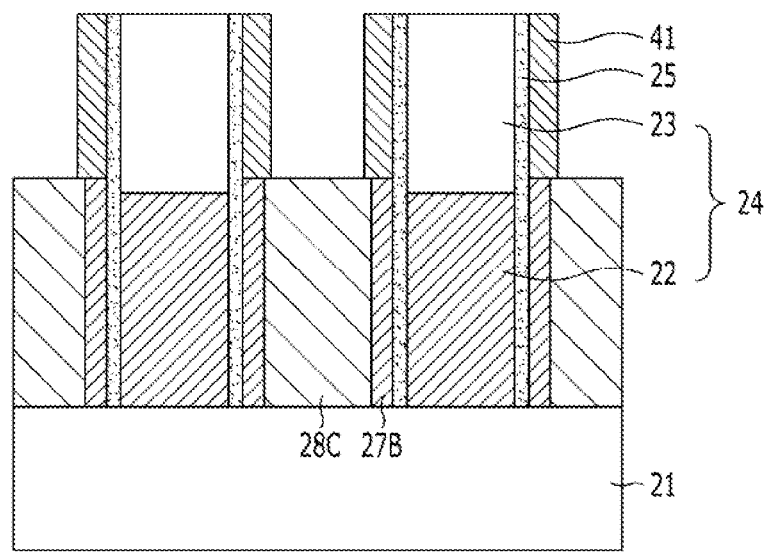

Referring to FIG. 7A, a capping substance layer 41A is formed. The capping substance layer 41A may be conformally formed on the second conductive layer patterns 28C. The capping substance layer 41A include a substance that prevents occurrence of silicidation during a subsequent anneal process. That is to say, the capping substance layer 41A may include a substance that does not react with the sacrificial spacers 27B. The capping substance layer 41A may include a dielectric substance. The capping substance layer 41A may include silicon oxide or silicon nitride. Further, the capping substance layer 41A may include a metal nitride. The capping substance layer 41A may include titanium nitride.

Referring to FIG. 76, by selectively etching the capping substance layer 41A, capping spacers 41 are formed. The capping spacers 41 may have shapes that cover the sacrificial spacers 27B and may expose the surfaces of the second conductive layer patterns 28C.

Figure 7C:
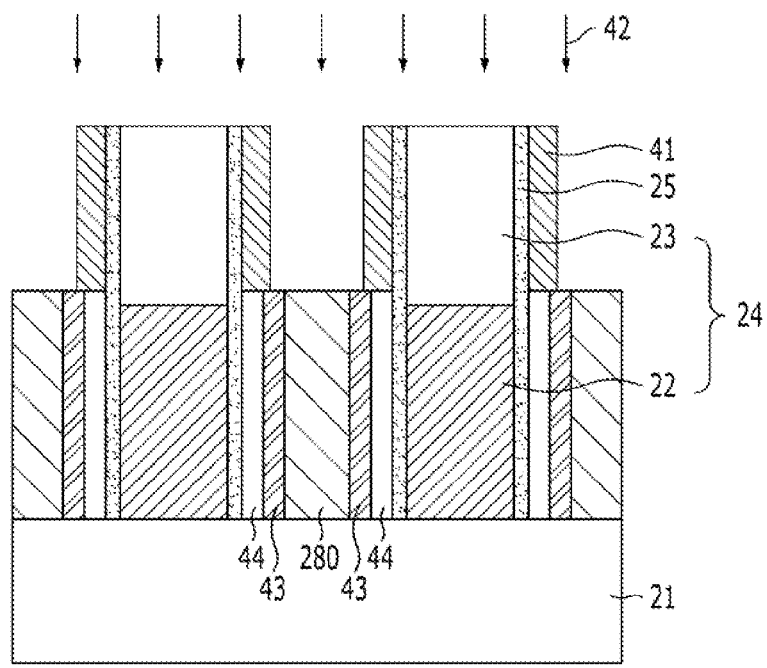

Referring to FIG. 7C, anneal 42 is performed. Accordingly, metal silicidation occurs. In detail, as silicidation occurs on the sidewalls of the sacrificial spacers 27B and the second conductive layer patterns 28C, metal silicide layers 43 are formed. As the metal silicide layers 43 are formed, second conductive layer patterns 280 with a decreased line width are formed, and air gaps 44 are defined between the second conductive layer patterns 280 and the sidewalls of the first conductive structures 24. In other words, as the metal silicide layers 43 are formed, when the sacrificial spacers 27B and the second conductive layer patterns 28C reach each other and phase transition occurs to the metal silicide layers 43, since volumes shrink, the air gaps 44 are defined in a self-aligned manner. The anneal 42 may be performed at a temperature of at least 200° C. such that the sacrificial spacers 27B and the second conductive layer patterns 28C induce silicidation. When the metal silicide layers 43 are formed, silicidation of first conductive layer patterns 22 is suppressed. This is because the first conductive layer patterns 22 are protected by the spacers 25. Also, when the metal silicide layers 43 are formed, even though the air gaps 44 are simultaneously defined, the air gaps 44 may be protected by the capping spacers 41.

As the metal silicide layers 43 are formed on the sidewalks of the second conductive layer patterns 280 by the anneal 42 performed as described above, the air gaps 44 are defined in the self-aligned manner. By defining the air gaps 44 in this way, the parasitic capacitances between the first conductive layer patterns 22 and the second conductive layer patterns 280 may be reduced.

According to the third embodiment, the metal silicide layers 43 and the air gaps 44 may be simultaneously formed and defined through the anneal 42 after forming the capping spacers 41. Thus, due to the presence of the capping spacers 41, it may be possible to prevent the air gaps 44 from being open during a subsequent process.

Figure 7D:
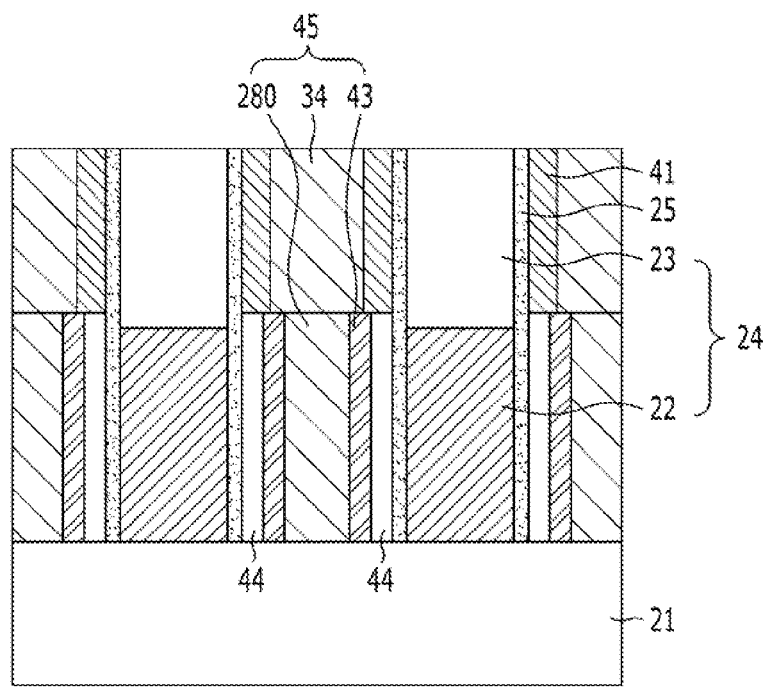

Referring to FIG. 7D, third conductive layer patterns 34 are formed on the second conductive layer patterns 280. The third conductive layer patterns 34 are surrounded by the capping spacers 41. The third conductive layer patterns 34 may include a tungsten layer.

By forming the third conductive layer patterns 34 as described above, second conductive structures 45 including the second conductive layer patterns 280 and the third conductive layer patterns 34 are formed. The second conductive layer patterns 280 may become the bottom plugs of storage node contact plugs, and the third conductive layer patterns 34 may become the top plugs of the storage node contact plugs. Since the second conductive layer patterns 280 include metal-containing layers and the third conductive layer patterns 34 include metal-containing layers, the second conductive structures 45 may be formed as metal plug structures.

Figure 8:
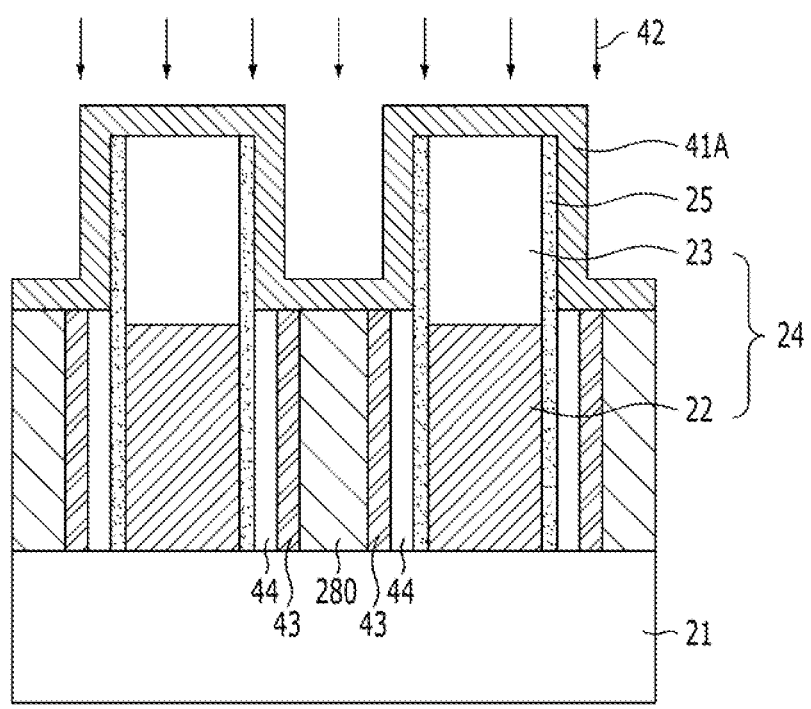
FIG. 8 is a cross-sectional view showing an exemplary method for forming a semiconductor device in accordance with a variation of the third embodiment of the present invention.

FIG. 8 is a cross-sectional view showing an exemplary method for forming a semiconductor device in accordance with a variation of the third embodiment of the present invention.

Referring to FIG. 8, after forming a capping substance layer 41A on an entire surface, anneal 42 may be performed. By the anneal 42, metal silicidation occurs. In detail, as silicidation occurs on the sidewalls of the sacrificial spacers 27B and the second conductive layer patterns 28C, metal silicide layers 43 are formed. As the metal silicide layers 43 are formed, second conductive layer patterns 280 with a decreased line width are formed, and air gaps 44 are defined between the second conductive layer patterns 280 and the sidewalls of the first conductive structures 24. In other words, as the metal silicide layers 43 are formed, when the sacrificial spacers 27B and the second conductive layer patterns 28C reach each other and phase transition occurs to the metal silicide layers 43, since volumes shrink, the air gaps 44 are defined in a self-aligned manner. The anneal 42 may be performed at a temperature of at least 200° C. such that the sacrificial spacers 27B and the second conductive layer patterns 28C induce silicidation. When the metal silicide layers 43 are formed, silicidation of first conductive layer patterns 22 is suppressed. This is because the first conductive layer patterns 22 are protected by the spacers 25. Also, when the metal silicide layers 43 are formed, even though the air gaps 44 are simultaneously defined, the air gaps 44 may be protected by the capping substance layer 41A.

As the metal silicide layers 43 are formed on the sidewalls of the second conductive layer patterns 280 by the anneal 42 performed as described above, the air gaps 44 are defined in the self-aligned manner.

Subsequently, as shown in FIGS. 7C and 7D, capping spacers 41 and third conductive layer patterns 34 may be formed.

FIGS. 9A to 9G are cross-sectional views showing an example in which the air gaps and the plugs according to the first embodiment of the present invention are applied to a method for fabricating a memory device.

Figure 9A:
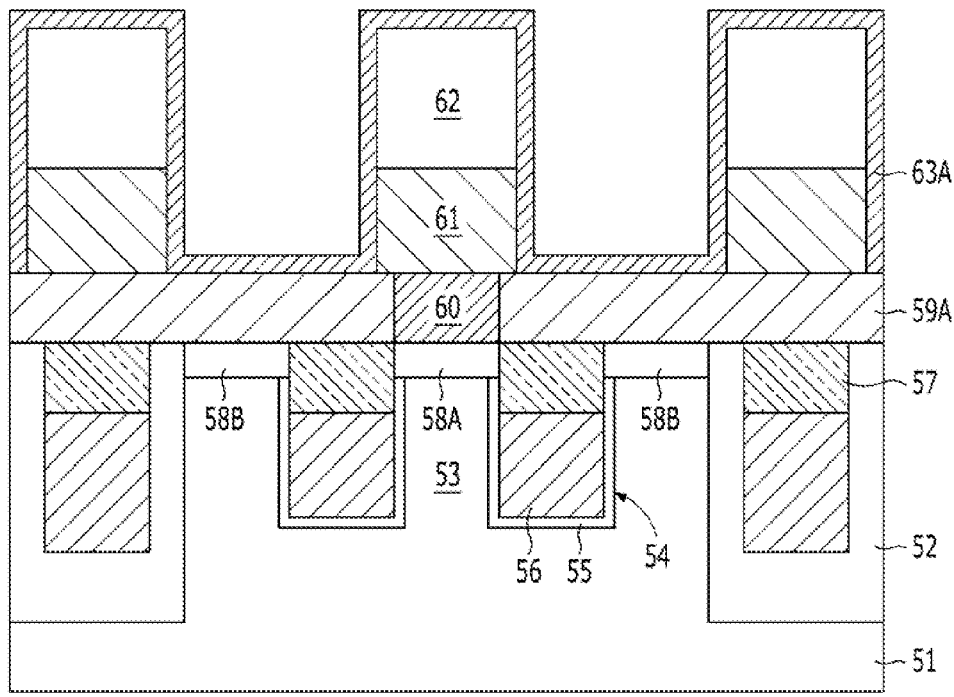
FIGS. 9A to 9G are cross-sectional views showing an example in which the air gaps and the plugs according to the first embodiment of the present invention are applied to a method for fabricating a memory device.

Referring to FIG. 9A, isolation regions 52 are formed in a substrate 51. As shown, a plurality of active regions 53 are defined. The substrate 51 may include a semiconductor substrate. The substrate 51 may include a silicon substrate, a silicon germanium substrate or an SOI substrate. The isolation regions 52 may be formed through an STI (shallow trench isolation) process. The active regions 53 may be defined by the isolation regions 52. The isolation regions 52 may include a all oxide layer, a liner and a gapfill substance layer, which are sequentially formed. The liner may include silicon nitride or silicon oxide. The silicon nitride may include $Si_3N_4$, and the silicon oxide may include $SiO_2$. The gapfill substance layer may include silicon oxide such as a spin-on dielectric (SOD). Also, the gapfill substance layer may include silicon nitride. The silicon nitride may include $Si_3N_4$.

Trenches 54 may be simultaneously defined in the active regions 53 and the isolation regions 52. Due to a difference in etching rate between the active regions 53 and the isolation regions 52, the trenches 54 may be defined deeper in the isolation regions 52 than in the active regions 53.

Gate dielectric layers 55 may be formed on the surfaces of the trenches 54. Buried gate electrodes 56 are formed on the respective gate dielectric layers 55 to partially fill the trenches 54. The buried gate electrodes 56 are recessed in the trenches 54. Due to this, the buried gate electrodes 56 each have a height lower than that of the surface of the substrate 51. The buried gate electrodes 56 may be formed by forming a metal-containing layer to gapfill the trenches 54 and then etching back the metal-containing layer. The metal-containing layer may include a substance that has, as its main constituent, a metal such as titanium, tantalum or tungsten. The metal-containing layer may include at least any one selected from the group consisting of tantalum nitride (TaN), titanium nitride (TiN), tungsten nitride (WN) and tungsten (W). For example, the buried gate electrodes 56 may independently include titanium nitride, tantalum nitride or tungsten, or may be formed into a double-layered structure such as TiN/W or TaN/W in which tungsten (W) is stacked on titanium nitride (TiN) or a tantalum nitride (TaN). Moreover, the buried gate electrodes 56 may include a double-layered structure of WN/W in which tungsten (W) is stacked on tungsten nitride (WN). Also, the buried gate electrodes 56 may include a metallic substance with low resistance.

A sealing layer 57 is formed on the buried gate electrodes 56. The sealing layer 57 may gapfill the trenches 54 on the buried gate electrodes 56. The sealing layer 57 may perform the function of protecting the buried gate electrodes 56 during a subsequent process. The sealing layer 57 may include a dielectric substance. The sealing layer 57 may include silicon nitride. The sealing layer 57 may be planarized.

Metal pads 58A and 58B are formed on the active regions 53. The metal pads 58A and 58B may be formed using a metal-containing layer. The metal pads 58A and 58B may include a metal silicide. While not shown, before forming the metal pads 58A and 58B, sources/drains may be formed through impurity ion implantation. The metal pads 58A and 58B may include first metal pads 58A and second metal pads 58B. The first metal pads 58A may be connected with bit line contact plugs, and the second metal pads 58B may be connected with storage node contact plugs. Contact areas with the active regions 53 may be increased by the first and second metal pads 58A and 58B, whereby contact resistance may be improved. In another embodiment, the first and second metal pads 58A and 58B may be formed after recessing the surfaces of the active regions 53 to a predetermined depth. Therefore, the contact areas may be further increased.

A first interlayer dielectric layer 59A is formed on an entire surface including the first and second metal pads 58A and 58B. The first interlayer dielectric layer 59A may include silicon oxide or silicon nitride.

After defining bit line contact holes (not shown) by etching the first interlayer dielectric layer 59A to expose the first metal pads 58A, bit line contact plugs 60 are formed by forming a conductive layer in the bit line contact holes. Bit line structures including bit lines 61 and bit line hard mask layers 62 are formed on the bit line contact plugs 60. The bit line contact plugs 60 may include a polysilicon layer or a metal-containing layer. The bit lines 61 may include a tungsten layer, or may include a barrier layer such as Ti/TiN and a tungsten layer on the barrier layer. The bit line hard mask layer 62 may include silicon nitride.

A spacer substance layer 63A is formed on an entire surface including the bit line structures. The spacer substance layer 63A may include silicon oxide or silicon nitride.

Figure 9B:
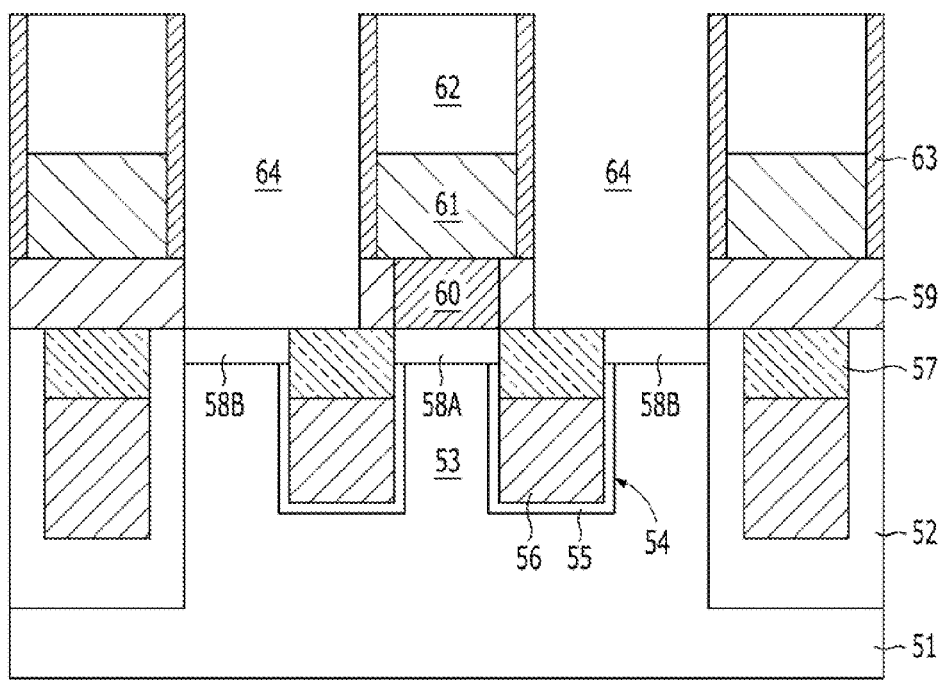

Referring to FIG. 9B, the spacer substance layer 63A is selectively etched. According to this, spacers 63 are formed on both sidewalls of the bit line structures. In order to form the spacers 63, an etch-back process may be performed. When forming the spacers 63, by etching the first interlayer dielectric layer 59A in a self-aligned manner, storage node contact holes 64 may be defined to expose the second metal pads 58B. The first interlayer dielectric layer 59A formed with the storage node contact holes 64 remains as indicated by the reference numeral 59.

Figure 9C:
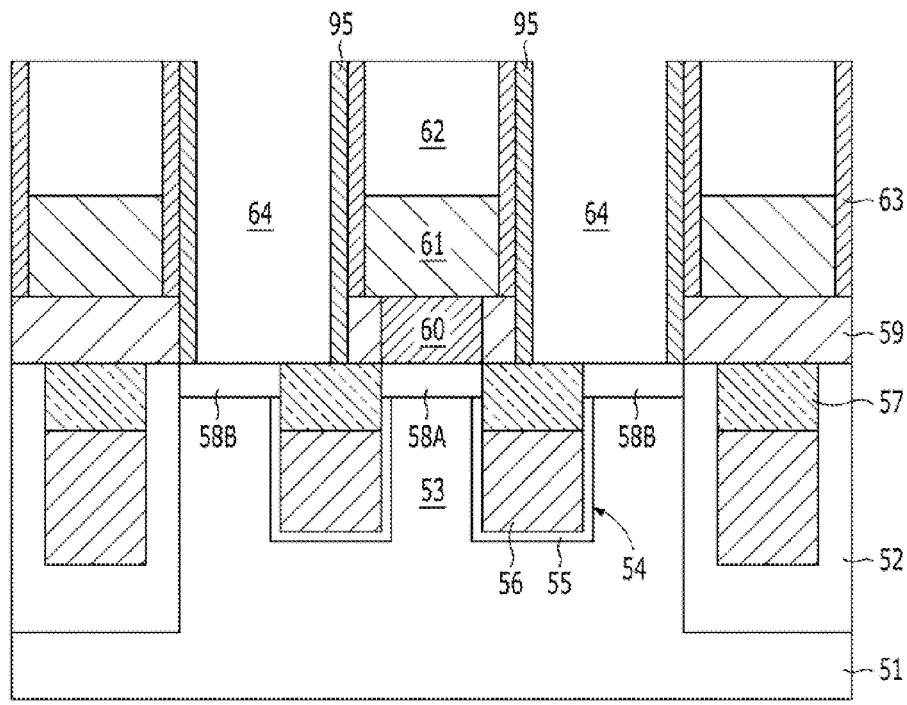

Referring to FIG. 9C, sacrificial spacers 65 are formed on the sidewalls of the storage node contact holes 64. The sacrificial spacers 65 may include a substance in which silicidation occurs during a subsequent process. Namely, the sacrificial spacers 65 may include a first silicidable substance. The sacrificial spacers 65 may include a silicon-containing layer. The sacrificial spacers 65 may include a polysilicon layer. A way of forming the sacrificial spacers 65 is as follows. First, a polysilicon layer (not shown) is formed on an entire surface including the storage node contact holes 64. Next, the polysilicon layer is etched back. Due to this, the sacrificial spacers 65 may be formed on the sidewalls of the storage node contact holes 64.

Figure 9D:
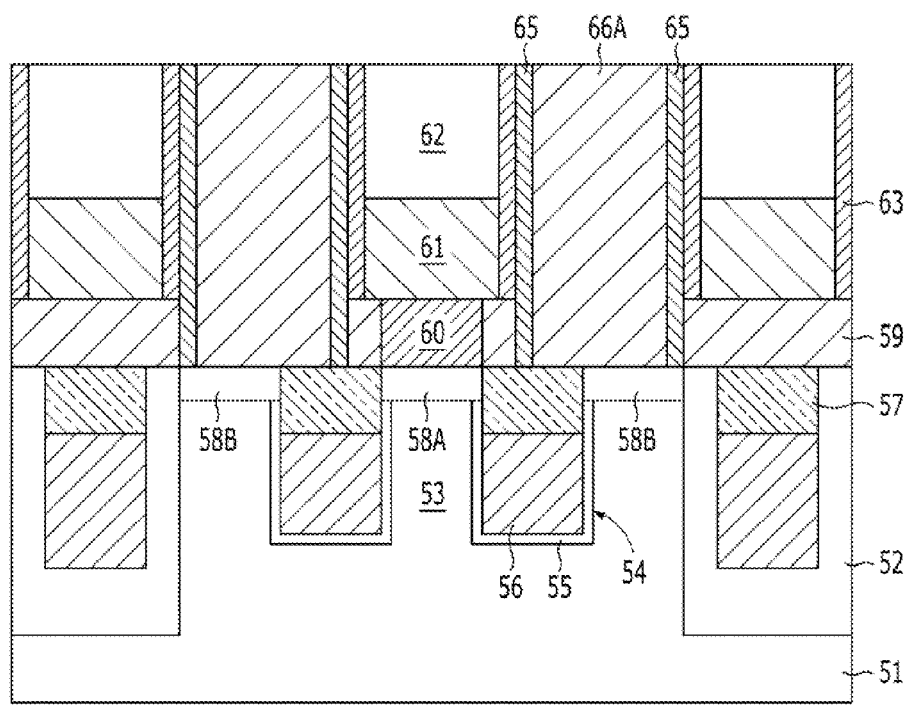

Referring to FIG. 9D, metal plugs 66A are formed. The metal plugs 66A may include a second silicidable substance. The metal plugs 66A may include a substance that forms metal silicides through reaction with the sacrificial spacers 65. The metal plugs 66A may include a silicidable metal layer. The metal plugs 66A may include titanium, tungsten or platinum. In order to form the metal plugs 66A, a metal-containing layer is formed on an entire surface including the sacrificial spacers 65. The metal-containing layer fills the storage node contact holes 64. Then the metal-containing layer is planarized. Accordingly, the metal plugs 66A are formed to fill the storage node contact holes 64. The metal plugs 66A may have shapes that are surrounded by the sacrificial spacers 65.

Figure 9E:
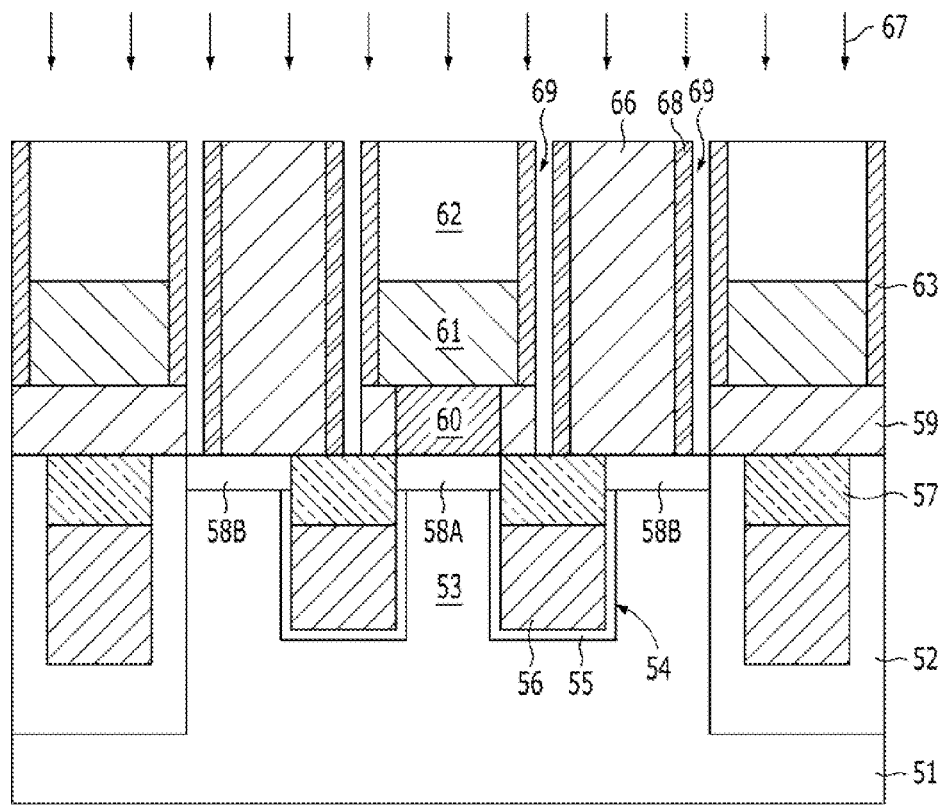

Referring to FIG. 9E, anneal 67 is performed. Accordingly, metal silicidation occurs. In detail, as silicidation occurs on the sidewalls of the sacrificial spacers 65 and the metal plugs 66A, metal silicide layers 68 are formed. As the metal silicide layers 68 are formed, storage node contact plugs 66 with a decreased line width are formed, and air gaps 69 are defined between the storage node contact plugs 66 and the sidewalls of the storage node contact holes 64.

As the metal silicide layers 68 are formed on the sidewalls of the storage node contact plugs 66 by the anneal 67 performed as described above, the air gaps 69 are defined in a self-aligned manner.

Figure 9F:
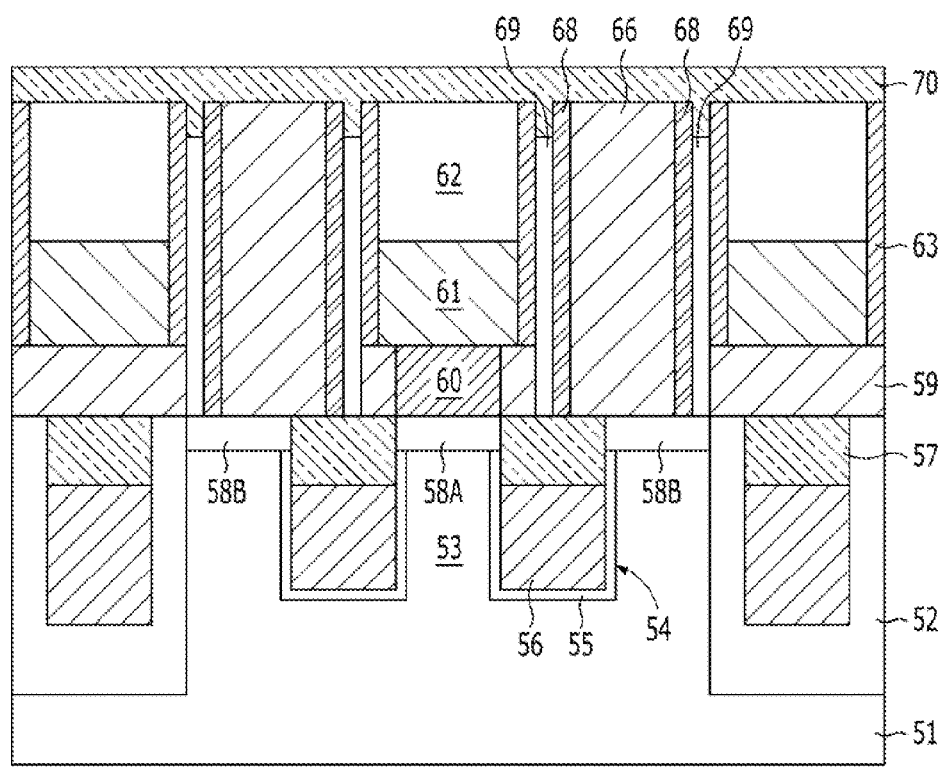

Referring to FIG. 9F, a capping layer 70 is formed to cap the air gaps 69. The capping layer 70 may include a dielectric substance. The capping layer 70 may include silicon oxide or silicon nitride.

Figure 9G:
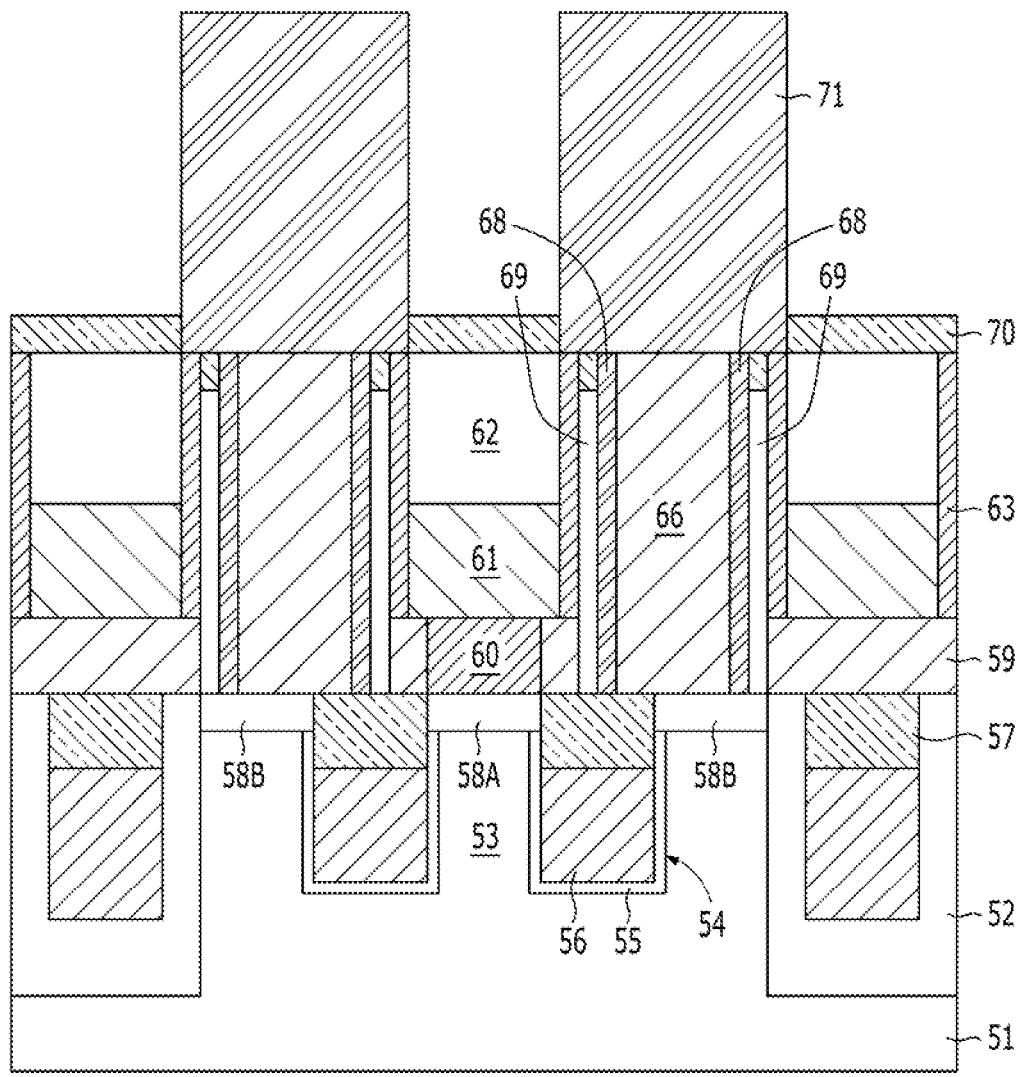

Referring to FIG. 9G, by etching the capping layer 70, the storage node contact plugs 66 are exposed. In succession, storage nodes 71 of capacitors are formed to be connected with the storage node contact plugs 66. The storage nodes 71 may have pillar shapes. In another embodiment, the storage nodes 71 may have cylindrical shapes. While not shown, a dielectric layer and plate nodes may be additionally formed on the storage nodes 71. In order to form the storage nodes 71, after forming a molding layer (not shown) on the capping layer 70, open parts are defined by etching the molding layer and the capping layer 70. Thereafter, the storage nodes 71 are formed in the open parts, and then, the molding layer may be removed through wet type dip-out. Portions of the capping layer 70 may remain to cap the air gaps 69.

Figure 10:
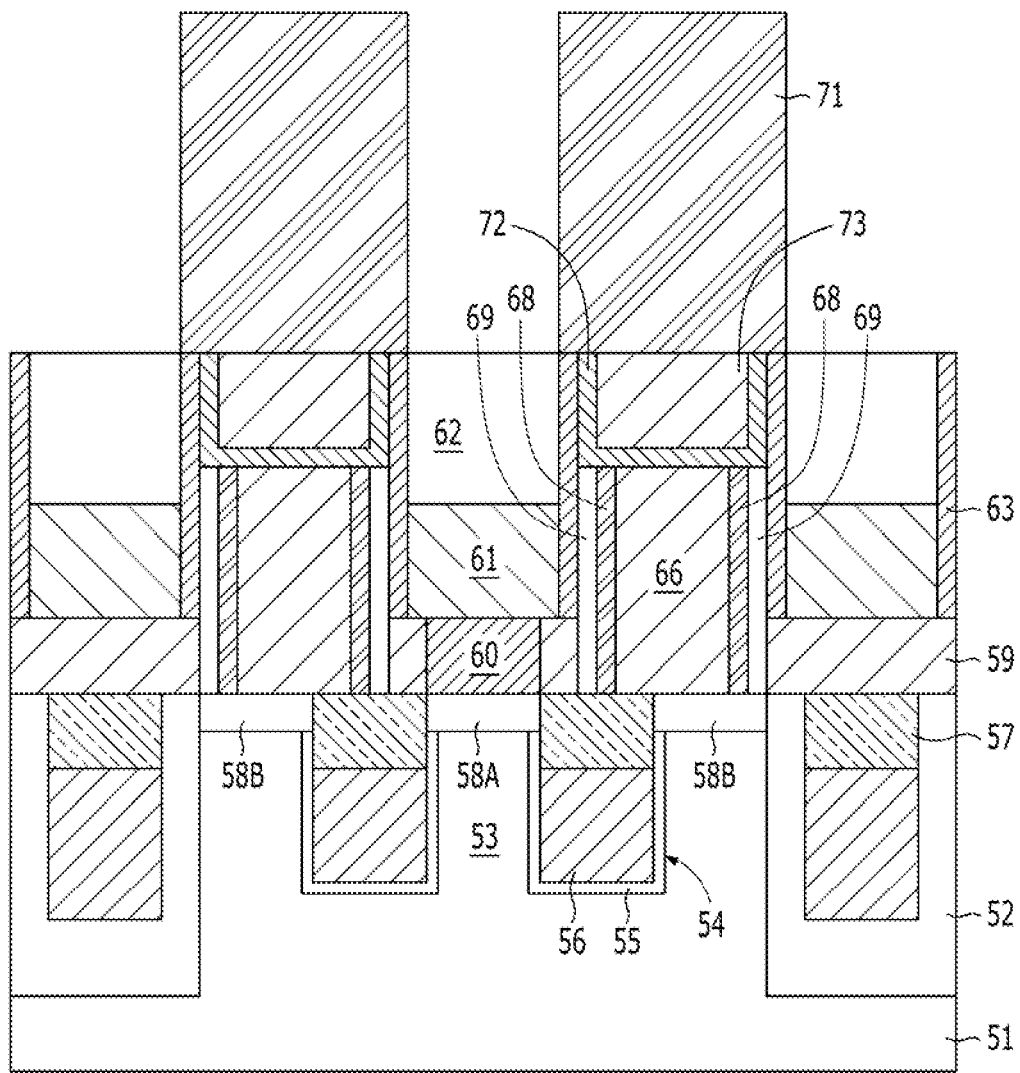
FIG. 10 is a cross-sectional view showing an example in which the air gaps and the plugs according to the second embodiment of the present invention are applied to a memory device.

FIG. 10 is a cross-sectional view showing an example in which the air gaps and the plugs according to the second embodiment of the present invention are applied to a memory device. In FIG. 10, storage node contact plugs have double metal plug structures. For a method before forming a silicidation preventing layer, reference may be made to the second embodiment and FIGS. 9A to 9D.

Descriptions will be made with reference to FIG. 10.

A silicidation preventing layer 72 and second storage node contact plugs 73 are formed on first storage node contact plugs 66 that are formed by being recessed. The silicidation preventing layer 72 includes a substance that prevents occurrence of silicidation during a subsequent anneal process. Namely, the silicidation preventing layer 72 may include a nitride. Since the silicidation preventing layer 72 may have conductivity, it may include a nitride with conductivity. The silicidation preventing layer 72 may include a metal nitride. The silicidation preventing layer 72 may include titanium nitride. The silicidation preventing layer 72 may also perform the function of a barrier layer. That is to say, the silicidation preventing layer 72 may perform the function of preventing reaction between the first storage node contact plugs 66 and the second storage node contact plugs 73. The second storage node contact plugs 73 may include a tungsten layer.

After forming the silicidation preventing layer 72 and the second storage node contact plugs 73, anneal is performed and metal silicide layers 68 are formed on the sidewalls of the first storage node contact plugs 66. While forming the metal silicide layers 68, air gaps 69 are defined in a self-aligned manner.

As can be readily seen, storage node contact plugs include the first storage node contact plugs 66, the metal silicide layers 68, the silicidation preventing layer 72 and the second storage node contact plugs 73. The metal silicide layers 68 are formed on the sidewalls of the first storage node contact plugs 66, and the air gaps 69 are defined between the metal silicide layers 68 and bit line structures. The air gaps 69 may be capped by the silicidation preventing layer 72.

Storage nodes 71 of capacitors are formed to be connected with the storage node contact plugs, that is, the second storage node contact plugs 73. The storage nodes 71 may have pillar shapes. In another embodiment, the storage nodes 71 may have cylindrical shapes. While not shown, a dielectric layer and plate nodes may be additionally formed on the storage nodes 71.

While not shown, the air gaps and the plugs according to the third embodiment of the present invention may be applied to a memory device.

The air gaps and the plugs according to the above-described embodiments may be applied to a DRAM (dynamic random access memory). It is to be noted that the present invention is not limited to such an example and may be applied to an SRAM (static random access memory), a flash memory, a FeRAM (ferroelectric random access memory), an MRAM (magnetic random access memory), a PRAM (phase change random access memory), and so forth.

Figure 11:
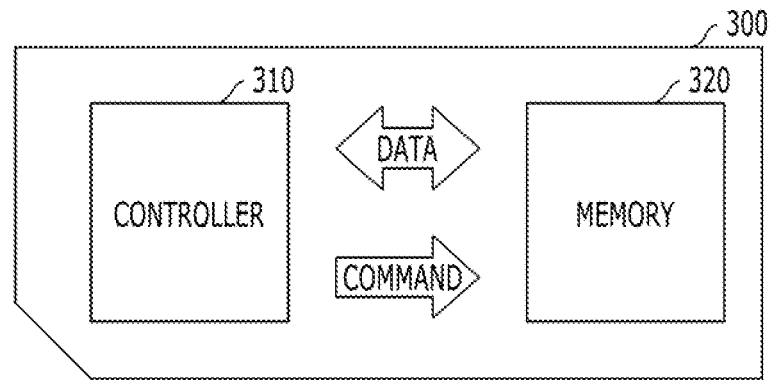
FIG. 11 is a schematic view showing a memory card.

FIG. 11 is a schematic view showing a memory card.

Referring to FIG. 11, a memory card 300 may include a controller 310 and a memory 320. The controller 310 and the memory 320 may exchange electric signals. For example, the memory 320 and the controller 310 may exchange data according to a command from the controller 310. Due to this, the memory card 300 may store data in the memory 320 or output data from the memory 320 to an outside. A certain portion of the memory 320 may include the air gaps and the plugs aforementioned above. Such memory card 300 may be used as data storage media of various portable appliances. For example, the memory card 300 may include a memory stick card, a smart media card (SM), a secure digital card (SD), a mini secure digital card (mini SD) or a multi media card (MMC).

Figure 12:
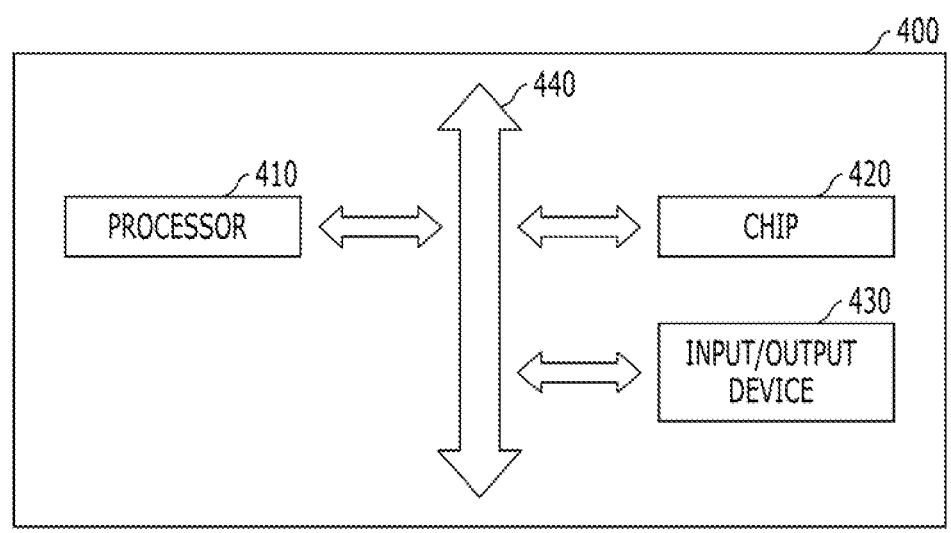
FIG. 12 is a block diagram showing an electronic system.

FIG. 12 is a block diagram showing an electronic system.

Referring to FIG. 12, an electronic system 400 may include a processor 410, a chip 420, and an input/output device 430. These components may implement data communication with one another by using a bus 440. The processor 410 may perform functions of executing a program and controlling the electronic system 400. The input/output device 430 may be used to input or output data to or from the electronic system 400. The electronic system 400 may be connected to an external device, for example, a personal computer or a network, by using the input/output device 430, and may exchange data with the external device. The chip 420 may store codes and data for the operations of the processor 410, and may partially process the operations given from the processor 410. For example, the chip 420 may include the air gaps and the plugs aforementioned above. The electronic system 400 may constitute various electronic control devices that need the chip 420. For example, the electronic system 400 may be applied to a mobile phone, an MP3 player, a navigator, a solid state disk (SSD), a household appliance, and so forth.

As is apparent from the above descriptions, in the embodiments, since air gaps are defined using silicidation when applying a metal plug and metal pad process for improving contact resistance, it may be possible to prevent loss of metal plugs or metal pads. Also, because a dip-out process is not necessary, process integration may be simplified.

Moreover, in the embodiments, since the air gaps are defined between conductive structures, parasitic capacitance may be reduced due to a low dielectric constant of the air gaps, and through this, a sensing margin may be secured.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:
    forming a plurality of semiconductor structures over a substrate;
    defining open parts between the semiconductor structures;
    forming sacrificial spacers over sidewalls of the open parts;
    forming conductive layer patterns in the open parts; and
    reacting the conductive layer patterns and the sacrificial spacers with each other, thereby defining air gaps on the sidewalls of the open parts.

2. The method according to claim 1, wherein the sacrificial spacers comprise a first silicidable substance layer, and the conductive layer patterns comprise a second silicidable substance layer.

3. The method according to claim 1, wherein the sacrificial spacers comprise a polysilicon layer, and the conductive layer patterns comprise a silicidable metal layer.

4. The method according to claim 3, wherein the silicidable metal layer comprises titanium, tungsten or platinum.

5. The method according to claim 2, wherein the forming of sacrificial spacers comprises:
    forming the first silicidable substance layer over an entire surface of the substrate including the open parts; and
    etching back the first silicidable substance layer to expose portions of the entire surface of the substrate.

6. The method according to claim 2, wherein the forming of conductive layer patterns comprises:
    forming the second silicidable substance layer over an entire surface of the substrate including the open parts, to fill the open parts; and
    planarizing the second silicidable substance layer until surfaces of the semiconductor structures are exposed.

7. The method according to claim 1, wherein the defining of air gaps comprises:
    annealing and silicidating the conductive layer patterns and the sacrificial spacers.

8. The method according to claim 1, wherein, after the defining of open parts, the method further comprises:
    forming dielectric spacers on the sidewalls of the open parts.

9. The method according to claim 1, wherein the semiconductor structures comprise bit line structures, and the conductive layer patterns comprise storage node contact plugs.

* * * * *